United States Patent
Tseng et al.

(10) Patent No.: US 10,573,811 B2
(45) Date of Patent: Feb. 25, 2020

(54) RESISTIVE RANDOM-ACCESS MEMORY (RRAM) CELL WITH RECESSED BOTTOM ELECTRODE SIDEWALLS

(71) Applicant: Taiwan Semiconductor Manufacturing Co., Ltd., Hsin-Chu (TW)

(72) Inventors: Yuan-Tai Tseng, Zhubei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/846,879

(22) Filed: Dec. 19, 2017

(65) Prior Publication Data

US 2019/0044065 A1    Feb. 7, 2019

Related U.S. Application Data

(60) Provisional application No. 62/540,319, filed on Aug. 2, 2017.

(51) Int. Cl.
*H01L 45/00* (2006.01)
*H01L 27/24* (2006.01)

(52) U.S. Cl.
CPC .......... *H01L 45/1253* (2013.01); *H01L 27/24* (2013.01); *H01L 45/08* (2013.01); *H01L 45/1233* (2013.01); *H01L 45/146* (2013.01); *H01L 45/147* (2013.01); *H01L 45/16* (2013.01); *H01L 45/1608* (2013.01); *H01L 45/1675* (2013.01); *H01L 45/1683* (2013.01); *H01L 45/1691* (2013.01); *H01L 45/145* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,209,392 | B1 * | 12/2015 | Sung | H01L 45/1233 |
| 9,431,603 | B1 * | 8/2016 | Hsieh | H01L 45/085 |
| 2015/0311435 | A1 | 10/2015 | Liu et al. | |
| 2016/0049583 | A1 * | 2/2016 | Huang | H01L 45/1273 257/4 |
| 2017/0053967 | A1 | 2/2017 | Chuang et al. | |

* cited by examiner

*Primary Examiner* — Allen L Parker
*Assistant Examiner* — Frederick B Hargrove
(74) *Attorney, Agent, or Firm* — Eschweiler & Potashnik, LLC

(57) ABSTRACT

Various embodiments of the present application are directed towards an integrated circuit comprising a resistive random-access memory (RRAM) cell with recessed bottom electrode sidewalls to mitigate the effect of sidewall plasma damage. In some embodiments, the RRAM cell includes a lower electrode, a data storage element, and an upper electrode. The lower electrode includes a pair of recessed bottom electrode sidewalls respectively on opposite sides of the lower electrode. The data storage element overlies the lower electrode and includes a pair of storage sidewalls. The storage sidewalls are respectively on the opposite sides of the lower electrode, and the recessed bottom electrode sidewalls are laterally spaced from and laterally between the storage sidewalls. The upper electrode overlies the data storage element.

20 Claims, 14 Drawing Sheets

RESISTIVE RANDOM-ACCESS MEMORY (RRAM) CELL WITH RECESSED BOTTOM ELECTRODE SIDEWALLS

REFERENCE TO RELATED APPLICATION

This application claims the benefit of U.S. Provisional Application No. 62/540,319, filed on Aug. 2, 2017, the contents of which are incorporated herein by reference in their entirety.

BACKGROUND

Many modern day electronic devices include non-volatile memory. Non-volatile memory is electronic memory that is able to store data in the absence of power. Some promising candidates for the next generation of non-volatile memory include resistive random-access memory (RRAM). RRAM has a relatively simple structure, and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
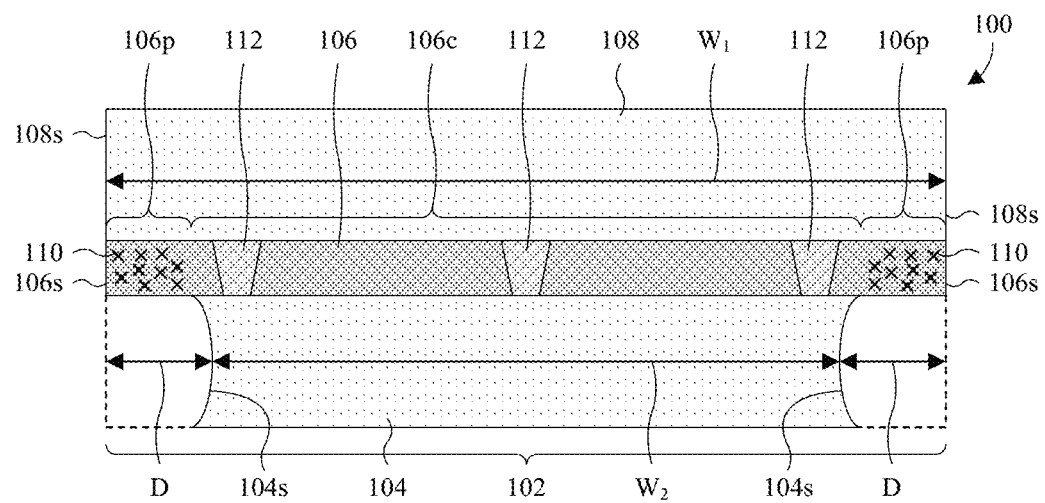
FIG. 1 illustrates a cross-sectional view of some embodiments of an integrated circuit (IC) comprising a resistive random-access memory (RRAM) cell with recessed bottom electrode sidewalls.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random-access memory (RRAM) cell generally comprises a bottom electrode, a data storage element overlying the bottom electrode, and a top electrode overlying the data storage element. Although the data storage element is normally insulating, the data storage element can be made to conduct through conductive filaments formed by application of an appropriate voltage across the RRAM cell. The conductive filaments may, for example, be defined by defects in the data storage element, such as, for example, oxygen vacancies or some other type of defect. Once the conductive filaments are formed, the conductive filaments may be reset (i.e., broken, resulting in a high resistance) or set (re-formed, resulting in a lower resistance) by application of an appropriate voltage across the RRAM cell. The low and high resistances are utilized to represent a data bit (i.e., "1" or "0"), thereby allowing for data storage.

According to a method for forming an RRAM cell, a bottom electrode layer is formed covering a substrate. Further, a dielectric data storage layer is formed covering the bottom electrode layer, and a top electrode layer is formed covering the dielectric data storage layer. A first etch is performed into the top electrode layer to form a top electrode overlying the dielectric data storage layer. Further, sidewall spacers are formed overlying the dielectric data storage layer, and lining sidewalls of the top electrode. A second etch is performed into the dielectric data storage layer and the bottom electrode layer, with the sidewall spacers in place, to form a data storage element and a bottom electrode. The data storage element underlies the top electrode, and the bottom electrode underlies the data storage element.

A challenge with the method is that the second etch is generally performed by a plasma etch, which may damage sidewalls of the data storage element. For example, plasma may form pinhole defects in the sidewalls of the data storage element. The pinhole defects interfere with the defects defining the conductive filaments, thereby leading to abnormal and/or non-uniform conductive filaments along the sidewalls of the data storage element. Such abnormal and/or non-uniform conductive filaments may lead to a large variance in the high resistance state of the RRAM cell. Further, the abnormal and/or non-uniform conductive filaments may lead to ambiguity distinguishing between the low resistance state of the RRAM cell and the high resistance state of the RRAM cell. Accordingly, the pinhole defects may negatively affect the reliability and stability of the RRAM cell.

In view of the foregoing, various embodiments of the present application are directed towards an integrated circuit comprising an RRAM cell with recessed bottom electrode sidewalls to mitigate the effect of sidewall plasma damage, as well as a method for forming the RRAM cell. In some embodiments, the RRAM cell comprises a lower electrode, a data storage element, and an upper electrode. The lower electrode comprises a pair of electrode sidewalls that are respectively on opposite sides of the lower electrode. The data storage element overlies the lower electrode and comprises a pair of storage sidewalls. The storage sidewalls are respectively on the opposite sides of the lower electrode. The electrode sidewalls are laterally spaced from and laterally between the storage sidewalls, such that the electrode sidewalls are recessed relative to the storage sidewalls. The upper electrode overlies the data storage element.

Because the electrode sidewalls are recessed relative to the storage sidewalls, the bottom electrode produces a weak electric field along the storage sidewalls. Note that the electric field concentrates at corners of the bottom electrode, and the corners of the bottom electrode are laterally spaced away from the storage sidewalls because the electrode sidewalls are recessed. Because the electric field is low along the storage sidewalls, conductive filaments do not or are less likely to form along the storage sidewalls. This, in turn, prevents defects (e.g., pinhole defects or some other suitable defects) in the storage sidewalls from interfering with the conductive filaments. Such defects may, for example, form during formation of the IC. Further, because the defects do not or are less likely to interfere with the conductive filaments, the RRAM cell has high stability and high reliability. For example, the switching window (i.e., separation between a low resistance state and a high resistance state) is large, and the switching window is stable (i.e., substantially uniform).

With reference to FIG. 1, a cross-sectional view 100 of some embodiments of an IC comprising an RRAM cell 102 with recessed bottom electrode sidewalls 104s is provided. As seen hereafter, the RRAM cell 102 has high reliability and high stability due to the recessed bottom electrode sidewalls 104s. The RRAM cell 102 comprises a bottom electrode 104, a data storage element 106, and a top electrode 108.

The bottom electrode 104 is conductive and may be or comprise, for example, tantalum nitride (e.g., TaN), titanium nitride (e.g., TiN), platinum (e.g., Pt), iridium (e.g., Ir), ruthenium (e.g., Ru), tungsten (e.g., W), some other suitable conductive material(s), or any combination of the foregoing. As used herein, a term (e.g., conductive material) with a suffix of "(s)" may, for example, be singular or plural. Further, the bottom electrode 104 has a pair of sidewalls 104s on opposite sides of the bottom electrode 104. The sidewalls 104s are recessed, such that the sidewalls 104s are each laterally offset from a neighboring sidewall 106s of the data storage element 106 by a distance D. The distance D may be, for example, about 3-5 nanometers, about 5-10 nanometers, about 1-20 nanometers, or about 5-20 nanometers. Further, the distance D may be, for example, greater than about 2, 3, 5, or 10 nanometers. In some embodiments, the sidewalls 104s are curved and/or concave. In other embodiments, the sidewalls 104s are flat and/or planar when viewed in profile. In yet other embodiments, the sidewalls 104s have some other suitable profile and/or shape.

The data storage element 106 overlies the bottom electrode 104. In some embodiments, the data storage element 106 has a first width $W_1$ greater than a second width $W_2$ of the bottom electrode 104. The first width $W_1$ may, for example, be about 50-500 nanometers, about 50-200 nanometers, about 200-400 nanometers, about 500-600 nanometers, or about 100-400 nanometers. The first width $W_1$ may, for example, be about 2.5-100 times the distance D, about 2.5-50 times the distance D, about 50-100 times the distance D, or about 20-70 times the distance D. The second width $W_2$ may, for example, be about 10-460 nanometers, about 40-490 nanometers, about 10-200 nanometers, about 200-400 nanometers, or about 100-300 nanometers. The second width $W_2$ may, for example, be about 0.5-92 times the distance D, about 0.5-45 times the distance D, about 45-92 times the distance D, or about 20-70 times the distance D. The data storage element 106 reversibly change between a high resistive state and a low resistive state depending upon a voltage applied across the RRAM cell 102. The high and low resistive states may be used to represent a data bit (i.e., "1" or "0"). The data storage element 106 is or comprises hafnium oxide (e.g., HfO), tantalum oxide (e.g., TaO), niobium oxide (e.g., NbO), vanadium oxide (e.g., VO), aluminum oxide (e.g., AlO), titanium oxide (e.g., TiO), tantalum titanium oxide (e.g., TaTiO), hafnium aluminum oxide (e.g., HfAlO), hafnium tantalum oxide (e.g., HfTaO), tantalum aluminum oxide (e.g., TaAlO), zirconium lanthanum oxide (e.g., ZrLaO), some other suitable high κ dielectric(s), some other suitable dielectric(s), or any combination of the foregoing. As used herein, a high κ dielectric may be, for example, a dielectric with a dielectric constant κ greater than about 3.9, 5, 10, 15, or 20. Further, the data storage element 106 comprises defects 110 and conductive filaments 112. For ease of illustration, only some of the defects 110 are labeled 110.

The defects 110 are along the sidewalls 106s of the data storage element 106 and may be or comprise, for example, pinhole defects or some other suitable defects in a crystalline lattice of the data storage element 106. In some embodiments, the sidewalls 104s of the bottom electrode 104 are laterally spaced away from the defects 110. In some embodiments, the defects 110 are localized to a pair of peripheral portions 106p of the data storage element 106. The peripheral portions 106p of the data storage element 106 are respectively on opposite sides of the data storage element 106, and respectively border and define the sidewalls 106s of the data storage element 106. Further, the peripheral portions 106p of the data storage element 106 are respectively on opposite sides of a central portion 106c of the data storage element 106, and have an elevated concentration of defects (e.g., pinhole defects or some other suitable crystalline defects) relative to the central portion 106c of the data storage element 106. In some embodiments, the peripheral portions 106p of the data storage element 106 and/or the defects 110 do not overlie the bottom electrode 104. In some embodiments, the sidewalls 104s of the bottom electrode 104 are each laterally between the central portion 106c of the data storage element 106 and a neighboring one of the peripheral portions 106p of the data storage element 106. The conductive filaments 112 are laterally spaced between the sidewalls 106s of the data storage element 106, laterally offset from the defects 110. In some embodiments, the conductive filaments 112 are completely over the bottom electrode 104, and/or are defined by oxygen vacancies or some other suitable defects in the data storage element 106.

The top electrode 108 overlies the data storage element 106 and may be or comprise, for example, titanium nitride (e.g., TiN), tantalum nitride (e.g., TaN), platinum (e.g., Pt), iridium (e.g., Ir), tungsten (e.g., W), some other suitable conductive material(s), or any combination of the foregoing. Further, the top electrode 108 has a pair of sidewalls 108s on opposite sides of the top electrode 108.

During use of the RRAM cell 102, the conductive filaments 112 are reset or broken to change the data storage element 106 to a first resistive state (e.g., the high resistance state), and are set or re-formed to change the data storage element to a second resistive state (e.g., the low resistive state. The conductive filaments are reset or set by application of an appropriate electric field across the conductive filaments 112 using the bottom and top electrodes 104, 108.

By recessing the sidewalls 104s of the bottom electrode 104, the electric field is low along the sidewalls 106s of the data storage element 106 and hence along the defects 110. Namely, the electric field concentrates at corners of the bottom electrode 104. Further, the recessing moves the corners of the bottom electrode 104 away from the sidewalls 106s of the data storage element 106 and the defects 110. Therefore, the electric field is low across the sidewalls 106s of the data storage element 106 and the defects 110. Because the electric field is low across the sidewalls 106s and the defects 110, the conductive filaments 112 do not or are less likely to form along the sidewalls 106s of the data storage element 106. This, in turn, prevents the defects 110 from interfering with switching the RRAM cell 102, or otherwise mitigates the effect the defects 110 have on the switching of the RRAM cell 102.

Figure 2A:
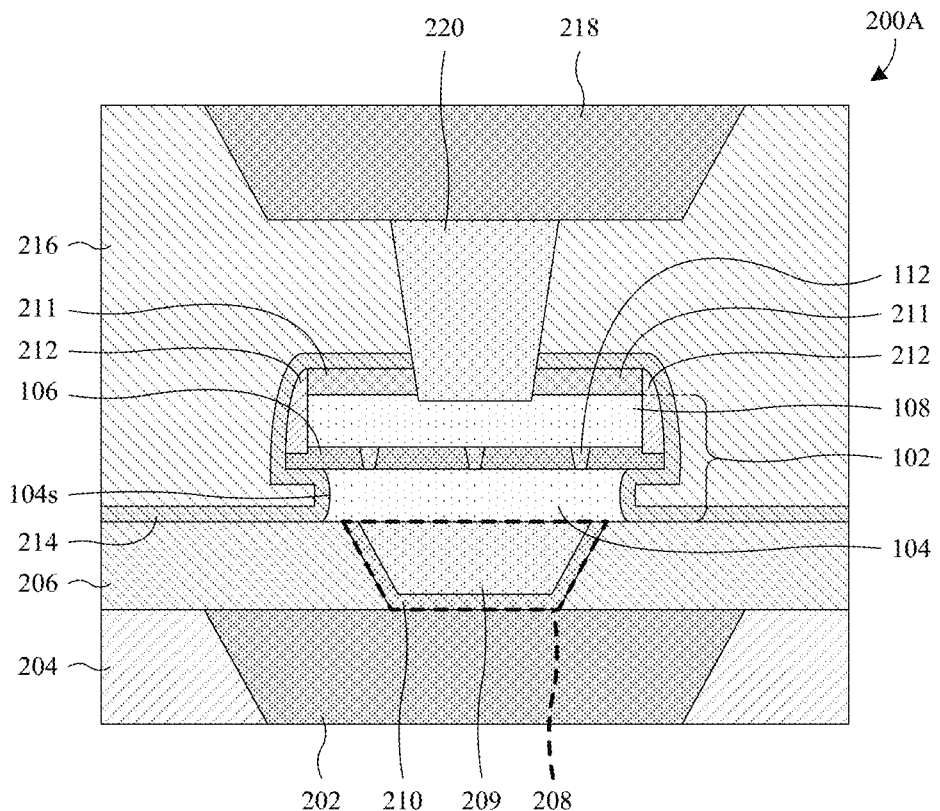
FIGS. 2A-2G illustrate cross-sectional views of various other more detailed embodiments of the IC of FIG. 1.

With reference to FIG. 2A, a cross-sectional view 200A of some more detailed embodiments of the IC of FIG. 1 is provided. As illustrated, a lower wire 202 is recessed into a lower interlayer dielectric (ILD) layer 204, and has a top surface even or substantially with that of the lower ILD layer 204. The lower ILD layer 204 may be or comprise, for example, silicon dioxide (e.g., $SiO_2$), a low κ dielectric, silicon nitride (e.g., SiN), some other suitable dielectric(s), or any combination of the foregoing. As used herein, a low κ dielectric may be, for example, a dielectric with a dielectric constant κ less than about 3.9, 3, 2, or 1. The lower wire 202 may be or comprise, for example, aluminum copper (e.g., AlCu), copper (e.g., Cu), aluminum (e.g., Al), tantalum (e.g., Ta), titanium nitride (e.g., TiN), tantalum nitride (e.g., TaN), some other suitable conductive material(s), or any combination of the foregoing. In some embodiments, the lower wire 202 and the lower ILD layer 204 partially define an interconnect structure underlying the RRAM cell 102, and/or overlie a semiconductor substrate (not shown) and/or semiconductor devices (not shown) formed in a top of the semiconductor substrate.

A lower insulating layer 206 overlies the lower wire 202 and the lower ILD layer 204, and accommodates a bottom electrode via (BEVA) 208. Further, as seen hereafter, the lower insulating layer 206 may serve as an etch stop during formation of the IC. The lower insulating layer 206 may be or comprise, for example, silicon carbide (e.g., SiC), silicon nitride (e.g., SiN), some other suitable dielectric(s), or any combination of the foregoing.

The BEVA 208 supports the RRAM cell 102 and extends through the lower insulating layer 206, from the bottom electrode 104 of the RRAM cell 102 to the lower wire 202. In some embodiments, the BEVA 208 has a top surface even or substantially even with that of the lower insulating layer 206. Further, in some embodiments, the BEVA 208 is distinct from the bottom electrode 104. The BEVA 208 may be or comprise, for example, copper (e.g., Cu), aluminum copper (e.g., AlCu), aluminum (e.g., Al), tungsten (e.g., W), titanium nitride (e.g., TiN), tantalum nitride (e.g., TaN), tantalum (e.g., Ta), some other suitable conductive material(s), or any combination of the foregoing.

In some embodiments, the BEVA 208 is homogeneous (e.g., a single material). In some of such embodiments, the BEVA 208 is integrated with the bottom electrode 104 and/or the same material as the bottom electrode 104. In other embodiments, the BEVA 208 is heterogeneous. In some of such embodiments, the BEVA 208 comprises a conductive plug 209 and a barrier element 210. The barrier element 210 cups an underside of the conductive plug 209 and blocks material from the conductive plug 209 from diffusing or otherwise moving through the barrier element 210 to underlying structure. The barrier element 210 may be or comprise, for example, titanium nitride (e.g., TiN), tantalum nitride (e.g., TaN), tantalum (e.g., Ta), some other suitable conductive barrier material(s) for the conductive plug 209, or any combination of the foregoing. The conductive plug 209 may be or comprise, for example, copper (e.g., Cu), aluminum copper (e.g., AlCu), aluminum (e.g., Al), tungsten (e.g., W), some other suitable conductive material(s), or any combination of the foregoing. In some embodiments, the conductive plug 209 is integrated with and/or the same material as the bottom electrode 104.

A hard mask 211 overlies the RRAM cell 102, and a spacer 212 overlies the data storage element 106 of the RRAM cell 102. The spacer 212 comprises a pair of segments respectively bordering opposite sidewalls of the top electrode 108 of the RRAM cell 102. In some embodiments, the segments respectively border opposite sidewalls the hard mask 211 that are respectively aligned with the opposite sidewalls of the top electrode 108. In some embodiments, the spacer 212 extends laterally along sidewalls of the top electrode 108 in a closed path to completely enclose the top electrode 108. Note that this is not visible within the cross-sectional view 200A of FIG. 2A. In some embodiments, the spacer 212 is sunken into a top surface of the data storage element 106 (e.g., due to over etching). The hard mask 211 and the spacer 212 may each be or comprise, for example, silicon nitride (e.g., SiN), silicon oxide (e.g., SiO), silicon oxynitride (e.g., SiON), some other suitable dielectric(s), or any combination of the foregoing.

An upper insulating layer 214 lines sidewalls of the RRAM cell 102 and the spacer 212, and further overlies the hard mask 211 and the lower insulating layer 206. In some embodiments, the upper insulating layer 214 is conformal and/or has a substantially uniform thickness throughout. Further, an upper ILD layer 216 overlies the upper insulating layer 214 and the lower insulating layer 206. The upper insulating layer 214 may be or comprise, for example, silicon oxide, some other dielectric(s), or any combination of the foregoing. The upper insulating layer 214 may be or otherwise comprise, for example, silicon dioxide (e.g., $SiO_2$), a low κ dielectric, silicon nitride (e.g., SiN), some other suitable dielectric(s), or any combination of the foregoing.

An upper wire 218 and a top electrode via (TEVA) 220 overlie the RRAM cell 102, and are within an upper ILD layer 216. The upper wire 218 is recessed into a top surface of the upper ILD layer 216, such that a top surface of the upper wire 218 is even or substantially even with a top surface of the upper ILD layer 216. The TEVA 220 extends from the upper wire 218, through the upper ILD layer 216, the upper insulating layer 214, and the hard mask 211, to the top electrode 108. In some embodiments, the upper wire 218 and the TEVA 220 are integrated. The upper wire 218 and the TEVA 220 may each be or comprise, for example, aluminum copper (e.g., AlCu), copper (e.g., Cu), aluminum (e.g., Al), tantalum (e.g., Ta), titanium nitride (e.g., TiN), tantalum nitride (e.g., TaN), some other conductive material(s), or any combination of the foregoing.

Figure 2B:
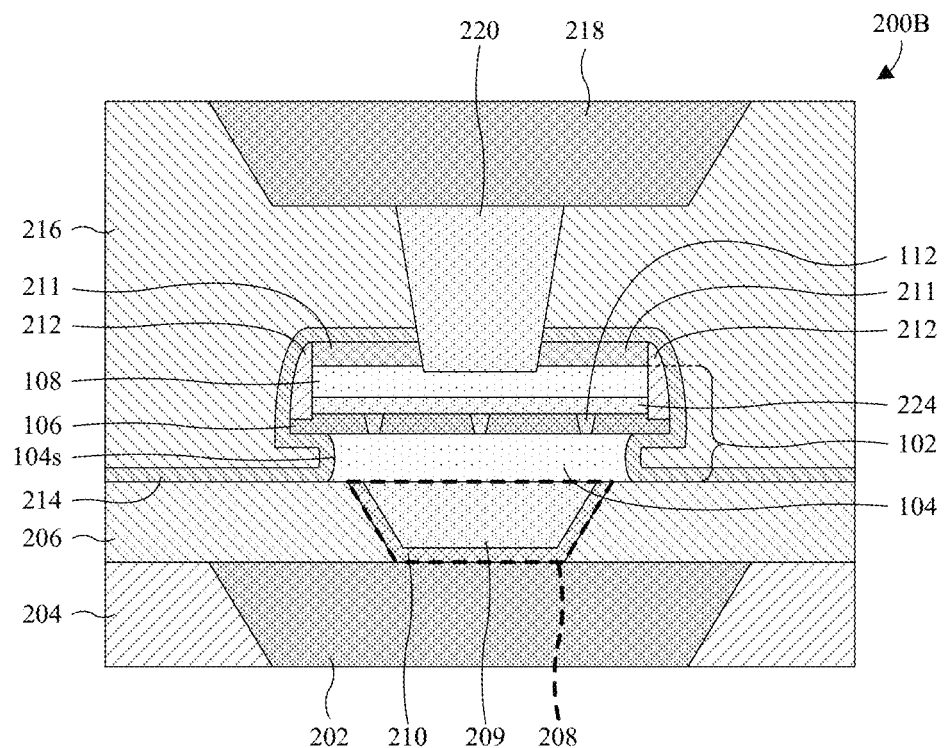

With reference to FIG. 2B, a cross-sectional view 200B of some other more detailed embodiments of the IC of FIG. 1 is provided. As illustrated, FIG. 2B is a variant of FIG. 2A in which the RRAM cell 102 further includes a capping element 224 between the top electrode 108 and the data storage element 106. In some embodiments, the segments of the spacer 212 respectively border opposite sidewalls of the capping element 224 that are respectively aligned with the opposite sidewalls of the top electrode 108. The capping element 224 has a low concentration of oxygen relative to the data storage element 106, and a high reactivity with oxygen (e.g., depends on less energy to react with oxygen) relative to the top electrode 108 and/or the bottom electrode 104. Further, the capping element 224 may be or comprise, for example, titanium (e.g., Ti), hafnium (e.g., Hf), zirconium (e.g., Zr), lanthanum (e.g., La), tantalum (e.g., Ta), aluminum (e.g., Al), some other suitable metal(s), or any combination of the foregoing.

As noted above, the conductive filaments 112 may, for example, be defined by oxygen vacancies in the data storage element 106. Further, as noted above, the conductive filaments 112 are broken and re-formed to change the data storage element 106 between different resistive states. Breaking the conductive filaments 112 fills some oxygen vacancies of the conductive filaments 112 with oxygen ions from a reservoir (not shown) along a top surface of the data storage element 106. Re-forming the conductive filaments 112 moves oxygen ions to the reservoir to generate oxygen vacancies extending the conductive filaments 112. The capping element 224 increases the size of the reservoir so a switching window of the RRAM cell 102 is large. The switching window may, for example, be the separation between a high resistive state of the RRAM cell 102 and a low resistive state of the RRAM cell 102.

Figure 2C:
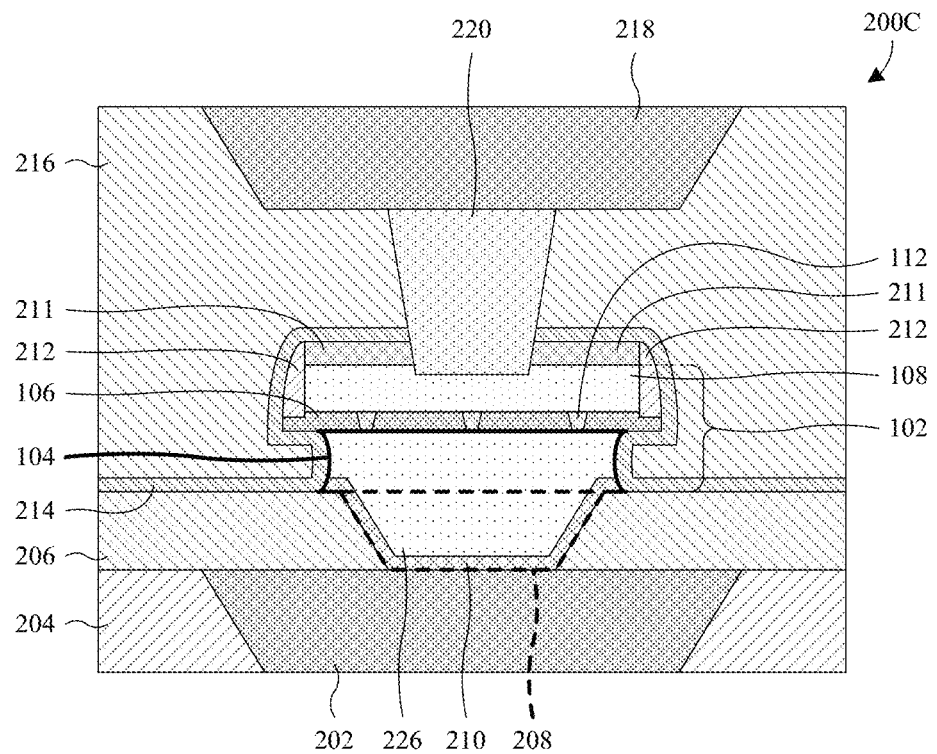

With reference to FIG. 2C, a cross-sectional view 200C of some other more detailed embodiments of the IC of FIG. 1 is provided. As illustrated, FIG. 2C is a variant of FIG. 2A in which the bottom electrode 104 and the BEVA 208 are integrated and at least partially defined by a lower conductive structure 226 common to the bottom electrode 104 and the BEVA 208. In some embodiments, the bottom electrode 104 and/or the BEVA 208 is/are further defined by the barrier element 210. The barrier element 210 overhangs the lower insulating layer 206, and cups an underside of the lower conductive structure 226 to block material of the lower conductive structure 226 from diffusing or otherwise moving through the barrier element 210 to underlying structure. The barrier element 210 may be or comprise, for example, tantalum (e.g., Ta), titanium (e.g., Ti), titanium nitride (e.g., TiN), tantalum nitride (e.g., TaN), some other suitable barrier material(s) for the lower conductive structure 226, or any combination of the foregoing. The lower conductive structure 226 may be or comprise, for example, aluminum copper (e.g., AlCu), copper (e.g., Cu), aluminum (e.g., Al), some other suitable metal(s), or any combination of the foregoing. In some embodiments, the lower conductive structure 226 is homogeneous (e.g., a single material).

Figure 2D:
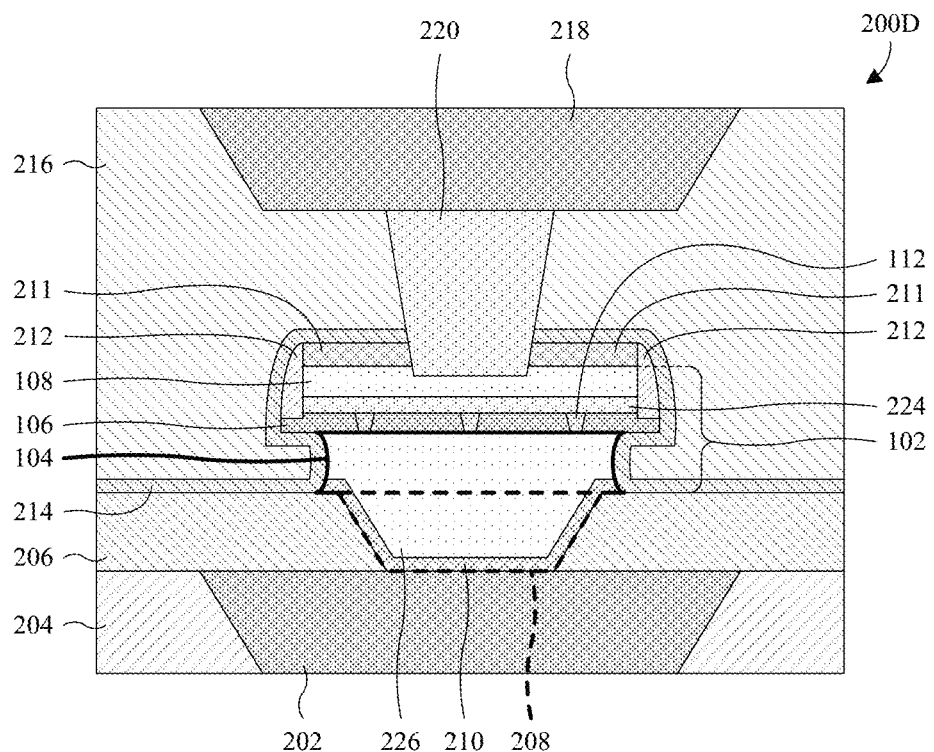

With reference to FIG. 2D, a cross-sectional view 200D of some other more detailed embodiments of the IC of FIG. 1 is provided. As illustrated, FIG. 2D is a variant of FIG. 2C in which the RRAM cell 102 further includes the capping element 224 between the top electrode 108 and the data storage element 106.

Figure 2E:
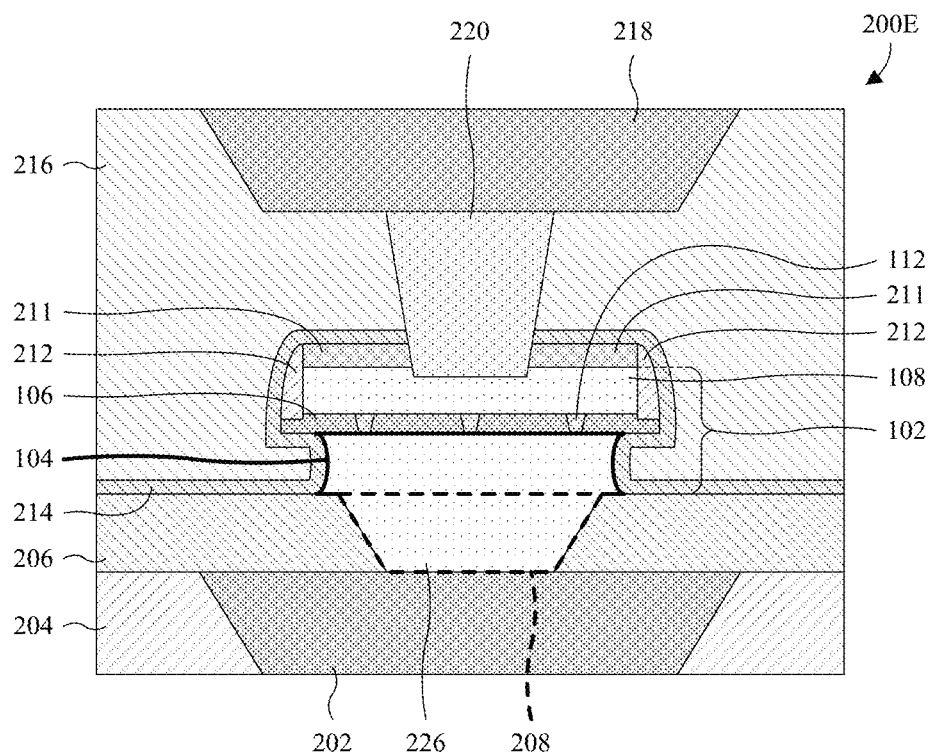
Figure 2F:
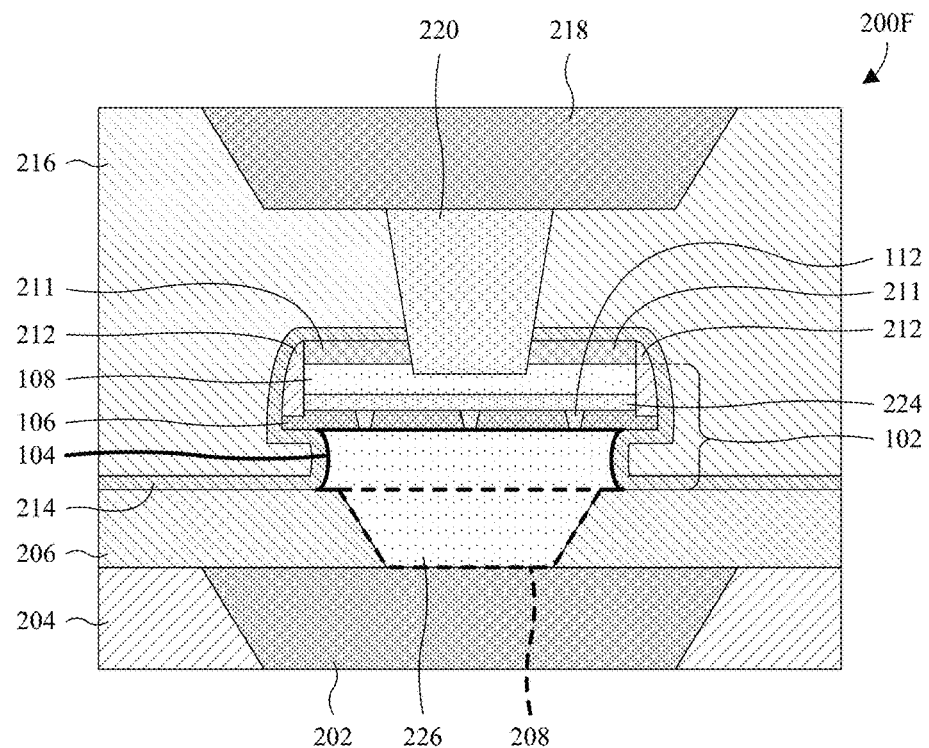

With reference to FIGS. 2E and 2F, cross-sectional views 200E, 200F of some other more detailed embodiments of the IC of FIG. 1 is provided. As illustrated, FIGS. 2E and 2F are respectively variants of FIGS. 2C and 2D in which the barrier element 210 is omitted. The lower conductive structure 226 may be or comprise, for example, tantalum (e.g., Ta), titanium (e.g., Ti), titanium nitride (e.g., TiN), tantalum nitride (e.g., TaN), some other suitable metal(s), some other suitable metal nitride(s), or any combination of the foregoing. In some embodiments, the lower conductive structure 226 is homogeneous (e.g., a single material).

Figure 2G:
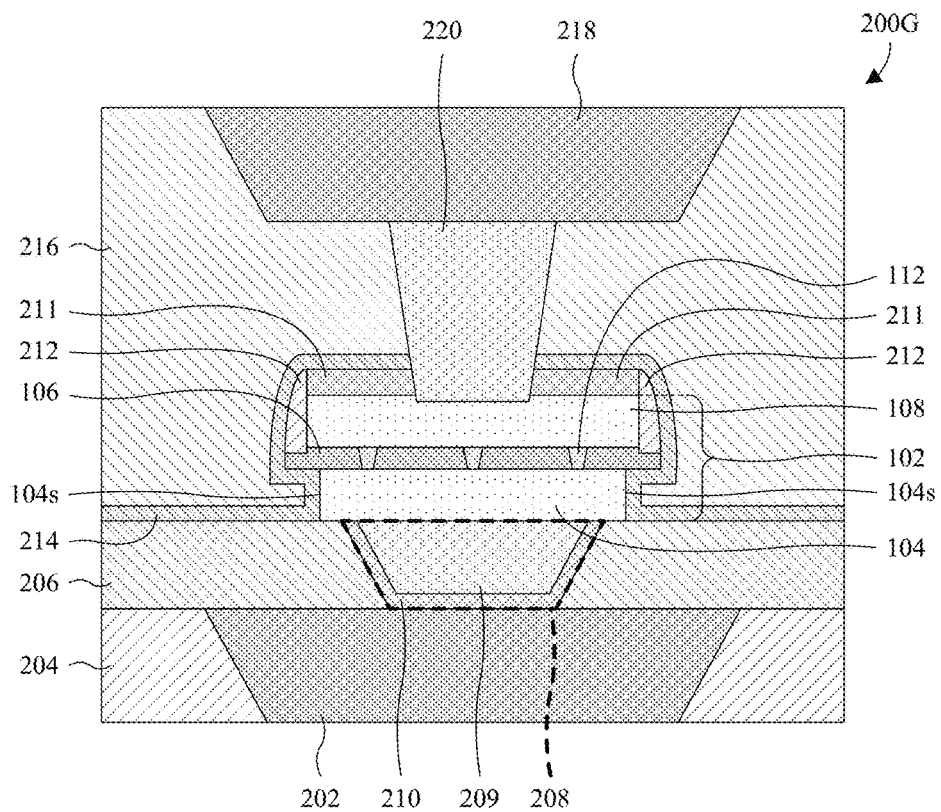

With reference to FIG. 2G, a cross-sectional view 200G of some more detailed embodiments of the IC of FIG. 1 is provided. FIG. 2G is a variant of FIG. 2A in which the sidewalls 104s of the bottom electrode 104 have a flat and/or planar profile, instead of a curved profile. While FIG. 2A is modified with the flat and/or planar profile, it is to be understood that any one of FIG. 2B-2F may also be modified with the flat and/or planar profile. For example, the sidewalls 104s of the bottom electrode 104 may have the flat and/or planar profile in any one of the FIG. 2B-2F. Further, notwithstanding that FIGS. 2A-2F illustrate the sidewalls 104s of the bottom electrode 104 as having curved profiles, and notwithstanding that FIG. 2G illustrates the sidewalls 104s of the bottom electrode 104 as having flat and/or planar profiles, the sidewalls 104s may have other profiles and/or shapes in other embodiments.

Figure 3:
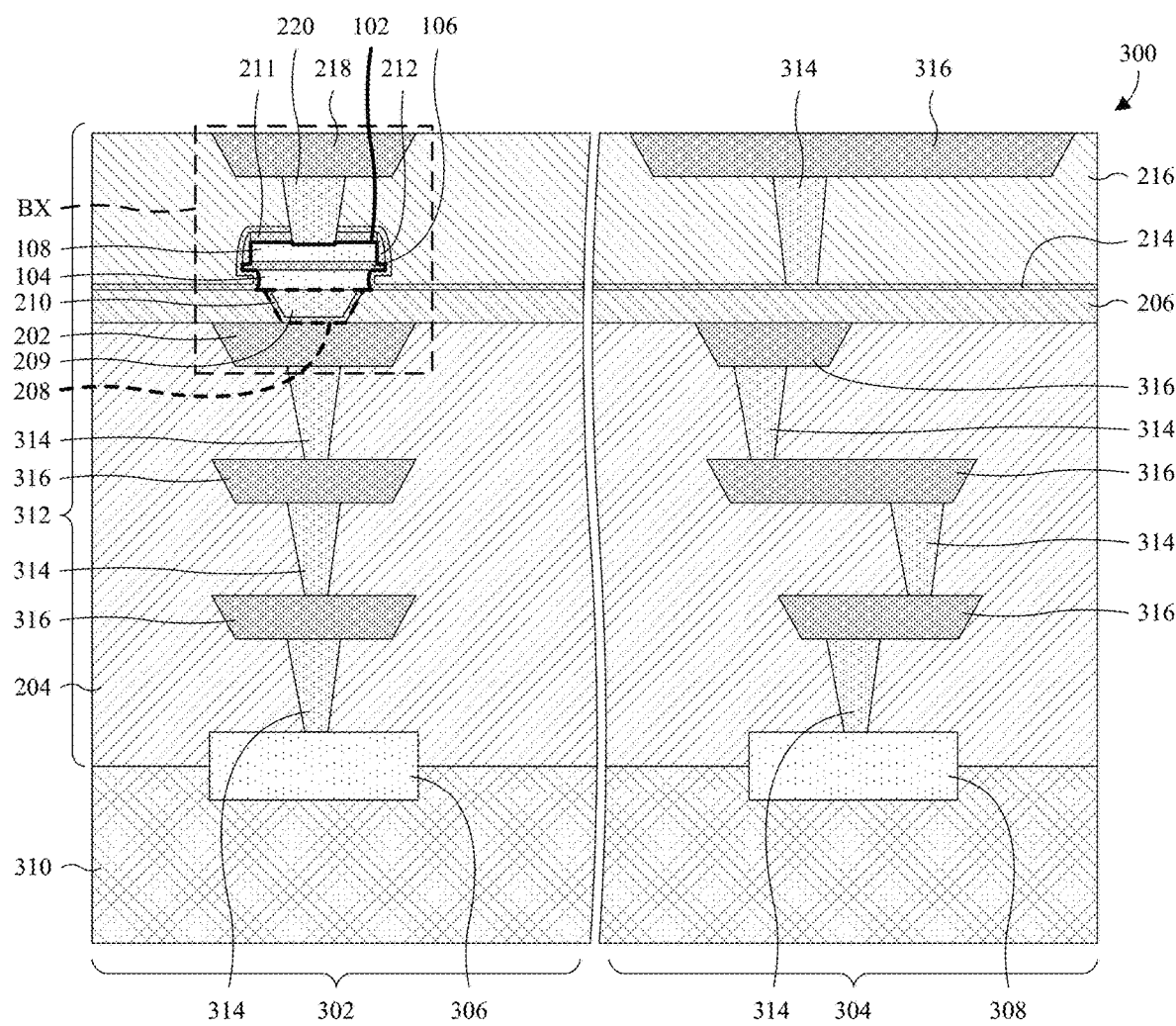
FIG. 3 illustrates an expanded cross-sectional view of some more detailed embodiments of the ICs of FIGS. 2A-2G.

With reference to FIG. 3, an expanded cross-sectional view 300 of some embodiments of the IC of FIGS. 2A-2G is provided. Any one of the cross-sectional views 200A-200F of FIGS. 2A-2G may, for example, be taken within box BX, notwithstanding that FIG. 3 is illustrated with the cross-sectional view 200A of FIG. 2A. The IC includes a memory region 302 and a logic region 304. The memory region 302 accommodates the RRAM cell 102. The RRAM cell 102 rests on the BEVA 208 and underlies the TEVA 220. Further, the bottom electrode 104 of the RRAM cell 102 has recessed sidewalls to mitigate the effect of sidewall defects in the data storage element 106 of the RRAM cell 102.

In some embodiments, the RRAM cell 102 is one of many RRAM cells defining a memory cell array (not labeled) in the memory region 302. In some embodiments, each RRAM cell of the memory cell array is as the RRAM cell 102 is shown and described with respect to FIG. 1 or any one of FIGS. 2A-2G. In some embodiments, each RRAM cell of the memory cell array rests on a BEVA and underlies a TEVA, and has a bottom electrode with recessed sidewalls. In some embodiments, each RRAM cell of the memory cell array overlies and is electrically coupled to an access device 306. The access device 306 facilitates access or selection of a corresponding RRAM cell in the memory cell array and may be, for example, an insulated field-effect transistor (IGFET), a metal-oxide-semiconductor field-effect transistor (MOSFET), or some other suitable type of semiconductor device.

The logic region 304 accommodates a logic device 308. The logic device 308 may be or comprise, for example, an IGFET, a MOFSET, or some other suitable type of semiconductor device. In some embodiments, the logic device 308 is one of many logic devices defining a logic core (not labeled). In some of such embodiments, operation of the logic core is supported or aided by the memory cell array, and/or the memory cell array is embedded memory. Further, in some embodiments, the logic device 308 supports operation of the RRAM cell 102 and/or the memory cell array. For example, the logic device 308 may facilitate reading and/or writing data from or to the RRAM cell 102 and/or the memory cell array.

In addition to the RRAM cell 102 and the logic device 308, the IC further comprises a semiconductor substrate 310 and a BEOL interconnect structure 312. The semiconductor substrate 310 supports and partially defines the logic device 308 and, in some embodiments, the access device 306. In some embodiments, the semiconductor substrate 310 further supports and partially defines a logic core that includes the logic device 308. The semiconductor substrate 310 may be, for example, a bulk silicon substrate, a silicon-on-insulator (SOI) substrate, or some other suitable type of semiconductor substrate. The BEOL interconnect structure 312 overlies the semiconductor substrate 310 and accommodates the RRAM cell 102. In some embodiments, the BEOL interconnect structure 312 further overlies and accommodates a memory cell array that includes the RRAM cell 102. The BEOL interconnect structure 312 comprises a dielectric stack and a plurality of conductive features.

The dielectric stack comprises a lower ILD layer 204 covering the semiconductor substrate 310 and the logic device 308. In some embodiments, the lower ILD layer 204 further covers the access device 306. The dielectric stack further comprises a lower insulating layer 206 covering the lower ILD layer 204, an upper insulating layer 214 covering the lower insulating layer 206, and an upper ILD layer 216 covering the upper insulating layer 214.

The conductive features are stacked in the dielectric stack to define conductive paths interconnecting the RRAM cell 102, the logic device 308, and other devices of the IC (e.g., the access device 306). The conductive features include the lower wire 202, the upper wire 218, the BEVA 208, and the TEVA 220. Further, the conductive features include a plurality of additional vias 314 and a plurality of additional wires 316. The additional vias 314 and the additional wires 316 may be or comprise, for example, tungsten (e.g., W), copper (e.g., Cu), aluminum copper (e.g., AlCu), aluminum (e.g., Al), some other suitable conductive material(s), or any combination of the foregoing.

With reference to FIGS. 4, 5, 6A, 6B, 7A, 7B, 8, 9A, 9B, and 10-19, a series of cross-sectional views 400, 500, 600A, 600B, 700A, 700B, 800, 900A, 900B, 1000-1900 of some embodiments of a method for forming an IC comprising a RRAM cell with recessed bottom electrode sidewalls is provided. The IC may be, for example, the IC of any one of FIGS. 2A-2G.

Figure 4:
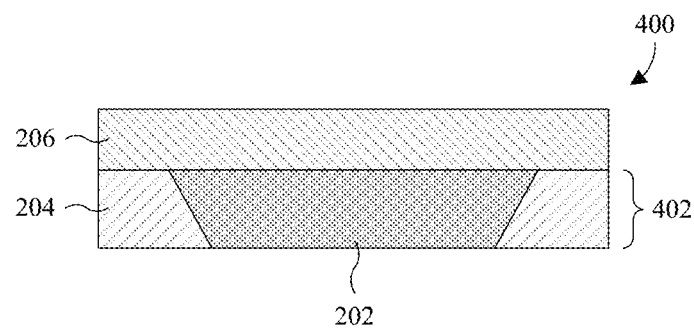
FIGS. 4, 5, 6A, 6B, 7A, 7B, 8, 9A, 9B, and 10-19 illustrate a series of cross-sectional views of some embodiments of a method for forming an integrated circuit comprising a RRAM cell with recessed bottom electrode sidewalls.

As illustrated by the cross-sectional view 400 of FIG. 4, a substrate 402 is provided or formed. The substrate 402 comprises a lower wire 202 and a lower ILD layer 204. Further, in some embodiments, the substrate 402 comprises the semiconductor substrate 310 of FIG. 3, a portion of the BEOL interconnect structure 312 of FIG. 3 that is below the lower wire 202, the access device 306 of FIG. 3, the logic device 308 of FIG. 3, or any combination of the foregoing. The lower wire 202 is recessed into a top of the lower ILD layer 204, such that a top surface of the lower wire 202 is even or substantially even with a top surface of the lower ILD layer 204. The lower wire 202 may be or comprise, for example, titanium nitride (e.g., TiN), tantalum (e.g., Ta), tantalum nitride (e.g., TaN), titanium (e.g., Ti), aluminum (e.g., Al), aluminum copper (e.g., AlCu), copper (e.g., Cu), some other suitable conductive material(s), or any combination of the foregoing. The lower ILD layer 204 may be or comprise, for example, silicon nitride (e.g., SiN), silicon oxide (e.g., SiO), silicon carbide (e.g., SiC), a low κ dielectric layer, some other suitable dielectric(s), or any combination of the foregoing.

Also illustrated by the cross-sectional view 400 of FIG. 4, a lower insulating layer 206 is formed covering the substrate 402. The lower insulating layer 206 may be or comprise, for example, silicon carbide (e.g., SiC), silicon nitride (e.g., SiN), silicon oxide (e.g., SiO), silicon oxynitride (e.g., SiON), some other suitable dielectric(s), or any combination of the foregoing. Further, the lower insulating layer 206 may, for example, be formed by chemical vapor deposition (CVD), physical vapor deposition (PVD), atomic layer deposition (ALD), some other suitable deposition process(es), or any combination of the foregoing. As used herein, a term (e.g., process) with a suffix of "(es)" may, for example, be singular or plural.

Figure 5:
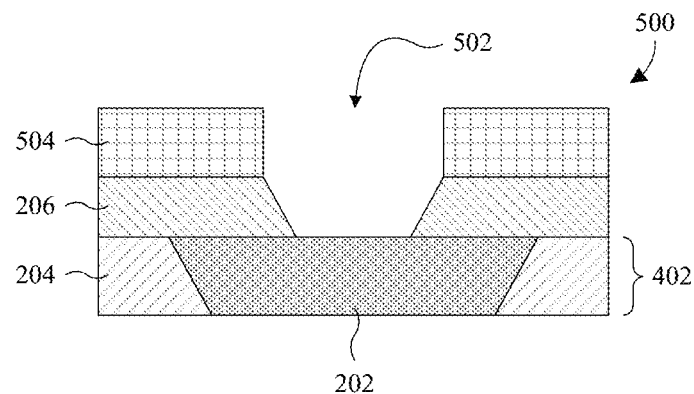

As illustrated by the cross-sectional view 500 of FIG. 5, a first etch is performed into the lower insulating layer 206 to form a lower opening 502 overlying and exposing the lower wire 202. In some embodiments, a process for performing the first etch comprises forming a photoresist mask 504 on the lower insulating layer 206. The photoresist mask 504 may, for example, be formed by depositing a photoresist layer on the lower insulating layer 206 and patterning the photoresist layer with a layout of the lower opening 502. The depositing may, for example, be performed by spin coating or some other suitable deposition process, and/or the patterning may, for example, be performed by photolithography or some other suitable patterning process. One or more first etchants are applied to the lower insulating layer 206 until the lower wire 202 is reached by the first etchant(s). The photoresist mask 504 is thereafter removed by, for example, plasma ashing or some other suitable removal process.

Figure 6A:
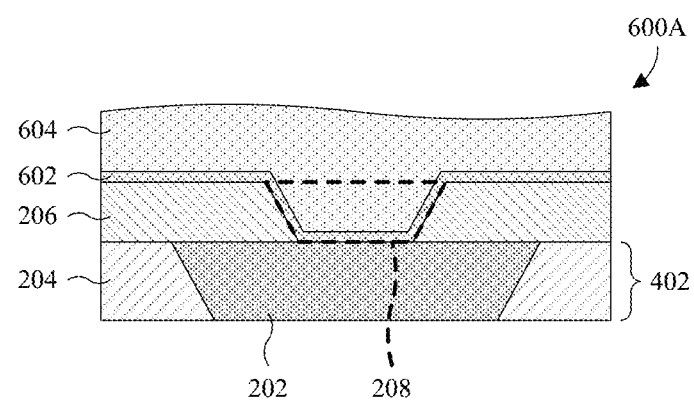

As illustrated by the cross-sectional view 600A of FIG. 6A, a barrier layer 602 is formed covering the lower insulating layer 206, and is further formed lining the lower opening 502 (see FIG. 5) so as to partially fill the lower opening 502. In some embodiments, the barrier layer 602 conformally lines the lower opening 502. The barrier layer 602 is conductive and, in some embodiments, is homogenous (e.g., a single material). The barrier layer 602 may, for example, be or comprise titanium (e.g., Ti), titanium nitride (e.g., TiN), tantalum (e.g., Ta), tantalum nitride (e.g., TaN), some other suitable conductive material(s), or any combination of the foregoing. Further, the barrier layer 602 may, for example, be formed by CVD, PVD, some other suitable deposition process(es), or any combination of the foregoing.

Also illustrated by the cross-sectional view 600A of FIG. 6A, a lower conductive layer 604 is formed covering the barrier layer 602, and further formed filling a remainder of the lower opening 502 (see FIG. 5), over the barrier layer 602. The lower conductive layer 604 is a different material than the barrier layer 602 and, in some embodiments, is homogeneous (e.g., a single material). Further, the lower conductive layer 604 and the barrier layer 602 define a BEVA 208 in the lower opening 502. The lower conductive layer 604 may be or comprise, for example, copper (e.g., Cu), aluminum copper (e.g., AlCu), aluminum (e.g., Al), tungsten (e.g., W), some suitable other metal(s), some other suitable conductive material(s), or any combination of the foregoing. In some embodiments, the barrier layer 602 is or otherwise comprises a barrier material for the lower conductive layer 604 so as to prevent material of the lower conductive layer 604 from diffusing or otherwise moving through the barrier layer 602 to surrounding structure. The lower conductive layer 604 may be formed by, for example, CVD, PVD, sputtering, electroless plating, electroplating, some other suitable plating or deposition process(es), or any combination of the foregoing.

Figure 6B:
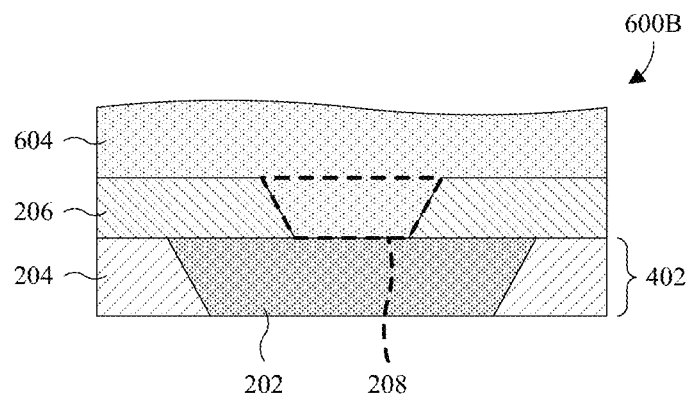

FIG. 6A is directed towards forming the ICs of FIGS. 2A-2D and 2G. In other embodiments, the acts of FIG. 6B are performed in place of the acts of FIG. 6A when forming the ICs of FIGS. 2E and 2F. In such other embodiments, as illustrated by the cross-sectional view 600B of FIG. 6B, the lower conductive layer 604 is formed covering the lower insulating layer 206 and further filling the lower opening 502 (see FIG. 5). However, in contrast with FIG. 6A, the barrier layer 602 of FIG. 6A is omitted. Note that this is not shown hereafter since a remainder of the method is illustrated proceeding from FIG. 6A. The lower conductive layer 604 may, for example, be formed as described with respect to FIG. 6A.

Figure 7A:
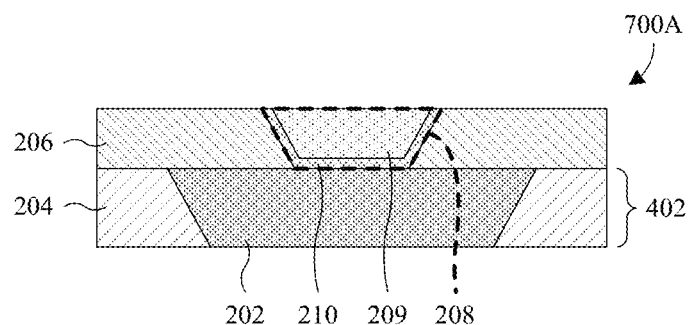

As illustrated by the cross-sectional view 700A of FIG. 7A, a first planarization is performed into a top surface of the lower conductive layer 604 (see FIG. 6A) and the barrier layer 602 (see FIG. 6A), until the lower insulating layer 206 is reached, to form a conductive plug 209 and a barrier element 210 in the lower opening 502 (see FIG. 5). The conductive plug 209 and the barrier element 210 define the BEVA 208 and are respectively formed from the lower conductive layer 604 and the barrier layer 602. The first planarization may, for example, be performed by a chemical mechanical polish (CMP) or some other planarization process.

Figure 7B:
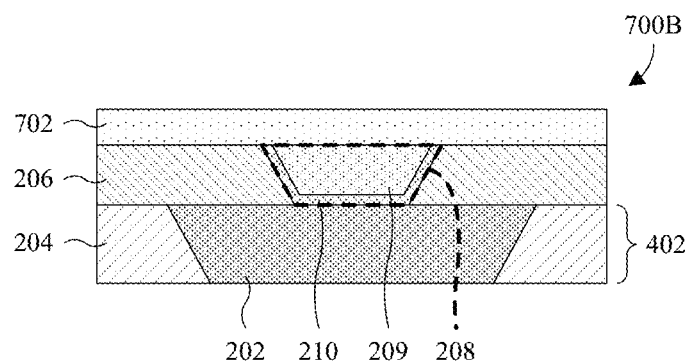

As illustrated by the cross-sectional view 700B of FIG. 7B, a bottom electrode layer 702 is formed cover the BEVA 208 and the lower insulating layer 206. The bottom electrode layer 702 is conductive, and may be or comprise, for example, platinum (e.g., Pt), iridium (e.g., Ir), ruthenium (e.g., Ru), tungsten (e.g., W), tantalum nitride (e.g., TaN), some other suitable metal(s), some other suitable metal nitride(s), or any combination of the foregoing. The bottom electrode layer 702 may, for example, be formed by CVD, PVD, electroless plating, electroplating, sputtering, some suitable other plating or deposition process(es), or any combination of the foregoing.

Figure 8:
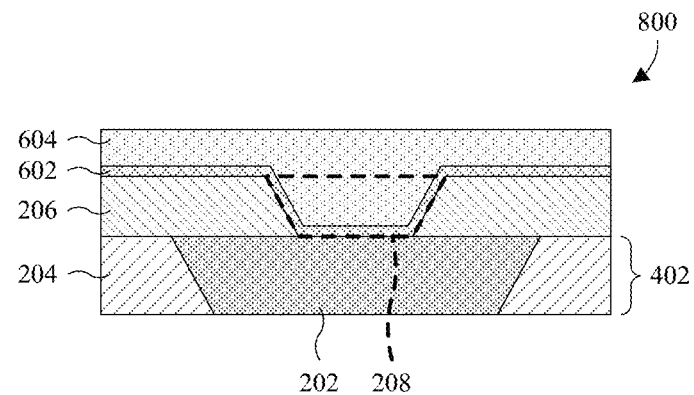

FIGS. 7A and 7B are directed towards forming the ICs of FIGS. 2A, 2B, and 2G and proceed from FIG. 6A. In other embodiments, the acts of FIG. 8 are performed in place of the acts of FIGS. 7A and 7B when forming the ICs of FIGS. 2C-2F. FIG. 8 proceeds from FIG. 6A to form the ICs of FIGS. 2C and 2D, as shown, and proceeds from FIG. 6B to form the ICs of FIGS. 2E and 2F. In the other embodiments, as illustrated by the cross-sectional view 800 of FIG. 8, the first planarization is performed into the top surface of the lower conductive layer 604 and stops before reaching the barrier layer 602 (where present) and the lower insulating layer 206. The lower conductive layer 604 and the barrier layer 602 (where present) may then be used in place of the bottom electrode layer 702 of FIG. 7B. However, note that this is not shown hereafter since a remainder of the method is illustrated proceeding from FIG. 7B.

Figure 9A:
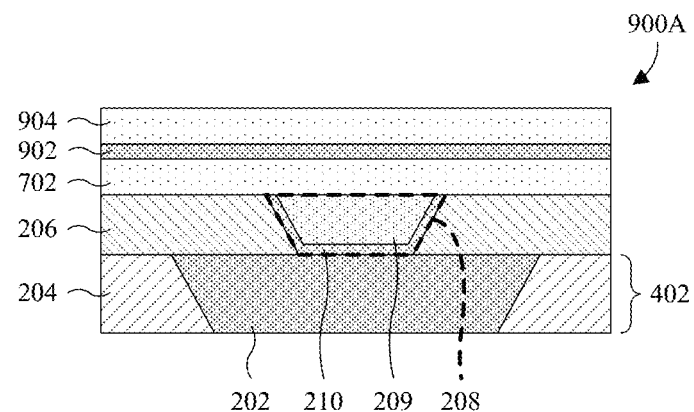

As illustrated by the cross-sectional view 900A of FIG. 9A, a data storage layer 902 and a top electrode layer 904 are formed on the bottom electrode layer 702. The data storage layer 902 is formed covering the bottom electrode layer 702. The top electrode layer 904 is formed covering the data storage layer 902. The top electrode layers 904 is conductive, and may be or comprise, for example, titanium nitride (e.g., TiN), tantalum nitride (e.g., TaN), some other suitable metal nitride(s), platinum (e.g., Pt), iridium (e.g., Ir), tungsten (e.g., W), some other suitable metal(s), or any combination of the foregoing. The data storage layer 902 reversibly changes between a first data state (e.g., a first resistance) and a second data state (e.g., a second resistance) depending upon a voltage applied across the data storage layer 902. The data storage layer 902 may be or comprise, for example, hafnium oxide (e.g., HfO), tantalum oxide (e.g., TaO), niobium oxide (e.g., NbO), vanadium oxide (e.g., VO), aluminum oxide (e.g., AlO), titanium oxide (e.g., TiO), tantalum titanium oxide (e.g., TaTiO), hafnium aluminum oxide (e.g., HfAlO), hafnium tantalum oxide (e.g., HfTaO), tantalum aluminum oxide (e.g., TaAlO), some other suitable high κ dielectric(s), or any combination of the foregoing. In some embodiments, the top electrode layer 904 and the data storage layer 902 are formed by CVD, PVD, electroless plating, electroplating, sputtering, some suitable other plating or deposition process(es), or any combination of the foregoing.

FIG. 9A is directed towards forming the ICs of FIGS. 2A, 2C, 2E, and 2G. In other embodiments, the acts of FIG. 9B may, for example, be performed in place of the acts of FIG. 9A when forming the ICs of FIG. 2B, 2D, or 2F. In such other embodiments, as illustrated by the cross-sectional view 900B of FIG. 9B, a capping layer 906 is formed covering the data storage layer 902, and the top electrode layer 904 is subsequently formed covering the capping layer 906. The capping layer 906 has a low concentration of oxygen relative to the data storage layer 902, and a high reactivity with oxygen (e.g., depends on less energy to react with oxygen) relative to the top electrode layer 904 and/or the bottom electrode layer 702. The capping layer 906 may be or comprise, for example, titanium (e.g., Ti), hafnium (e.g., Hf), zirconium (e.g., Zr), lanthanum (e.g., La), tantalum (e.g., Ta), aluminum (e.g., Al), some other suitable metal(s), or any combination of the foregoing. Further, the capping layer 906 may be formed by, for example, CVD, PVD, electroless plating, electroplating, sputtering, some suitable other plating or deposition process(es), or any combination of the foregoing.

After forming the capping layer 906 and the top electrode layer 904, the capping layer 906 may then be patterned with the top electrode layer 904 to form the RRAM cell under manufacture. However, note that this is not shown hereafter since a remainder of the method is illustrated proceeding from FIG. 9A.

Figure 9B:
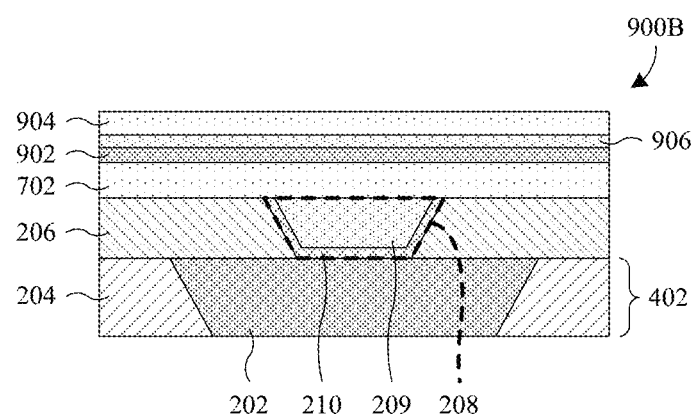

In view of the foregoing, FIGS. 6A, 6B, 7A, 7B, 8, 9A, and 9B described various different embodiments of the method. FIGS. 6A and 6B are alternative embodiments, such that the method proceeds from the acts of FIG. 5 to either: 1) the acts of FIG. 6A; or 2) the acts of FIG. 6B. FIG. 8 is an alternative to the embodiment of FIGS. 7A and 7B, such that the method proceeds from the acts of FIG. 6A or 6B to either: 1) the acts of FIGS. 7A and 7B; or 2) the acts of FIG. 8. FIGS. 9A and 9B are alternative embodiments, such that the method proceed from the acts of FIG. 7B or 8 to either: 1) the acts of FIG. 9A; or 2) the acts of FIG. 9B. Therefore, in some embodiments, the method includes the following sequence: The acts of FIG. 5 to the acts of FIG. 6A to the acts of FIG. 7A to the acts of FIG. 7B to the acts of FIG. 9A to the acts of FIG. 10. Note that the acts of FIGS. 10-19 are illustrated as proceeding from this sequence, but may proceed from any one of the following sequences in other embodiments. In other embodiments, the method includes the following sequence: the acts of FIG. 5 to the acts of FIG. 6A to the acts of FIG. 7A to the acts of FIG. 7B to the acts of FIG. 9B to the acts of FIG. 10. In other embodiments, the method includes the following sequence: the acts of FIG. 5 to the acts of FIG. 6A to the acts of FIG. 8 to the acts of FIG. 9A to the acts of FIG. 10. In other embodiments, the method includes the following sequence: the acts of FIG. 5 to the acts of FIG. 6A to the acts of FIG. 8 to the acts of FIG. 9B to the acts of FIG. 10. In other embodiments, the method includes the following sequence: the acts of FIG. 5 to the acts of FIG. 6B to the acts of FIG. 7A to the acts of FIG. 7B to the acts of FIG. 9A to the acts of FIG. 10. In other embodiments, the method includes the following sequence: the acts of FIG. 5 to the acts of FIG. 6B to the acts of FIG. 7A to the acts of FIG. 7B to the acts of FIG. 9B to the acts of FIG. 10. In other embodiments, the method includes the following sequence: the acts of FIG. 5 to the acts of FIG. 6B to the acts of FIG. 8 to the acts of FIG. 9A to the acts of FIG. 10. In other embodiments, the method includes the following sequence: the acts of FIG. 5 to the acts of FIG. 6B to the acts of FIG. 8 to the acts of FIG. 9B to the acts of FIG. 10.

Figure 10:
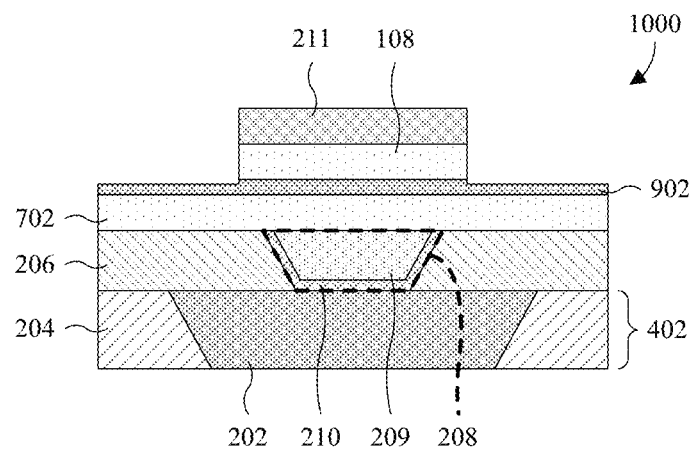

As illustrated by the cross-sectional view 1000 of FIG. 10, a hard mask 211 is formed covering an RRAM cell region of the top electrode layer 904 (see FIG. 9A) that overlies the BEVA 208. The hard mask 211 may be or comprise, for example, silicon nitride (e.g., SiN), some other suitable nitride(s), some other suitable dielectric(s), or any combination of the foregoing. Further, the hard mask 211 may, for example, be formed by depositing a hard mask layer on the top electrode layer 904 and patterning the hard mask layer into the hard mask 211. The depositing may, for example, be performed by CVD, PVD, or some other suitable deposition process, and/or the patterning may, for example, be performed by using a photolithography/etching process or some other suitable patterning process.

Also illustrated by the cross-sectional view 1000 of FIG. 10, a second etch is performed into the top electrode layer 904 (see FIG. 9A) with the hard mask 211 in place to form a top electrode 108 underlying the hard mask 211. In some embodiments, the data storage layer 902 serves as an etch stop for the second etch and/or the second etch over extends into the data storage layer 902 to partially etch the data storage layer 902.

Figure 11:
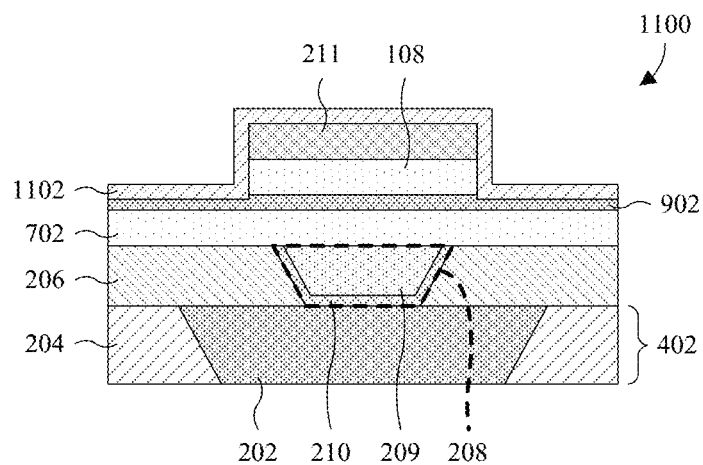

As illustrated by the cross-sectional view 1100 of FIG. 11, a spacer layer 1102 is formed covering and lining the structure of FIG. 10. In some embodiments, the spacer layer 1102 is formed conformally, and/or is formed by CVD, PVD, some other suitable deposition process(es), or any combination of the foregoing. The spacer layer 1102 may be, for example, silicon nitride (e.g., SiN), some other suitable nitride(s), some other suitable dielectric(s), or any combination of the foregoing.

Figure 12:
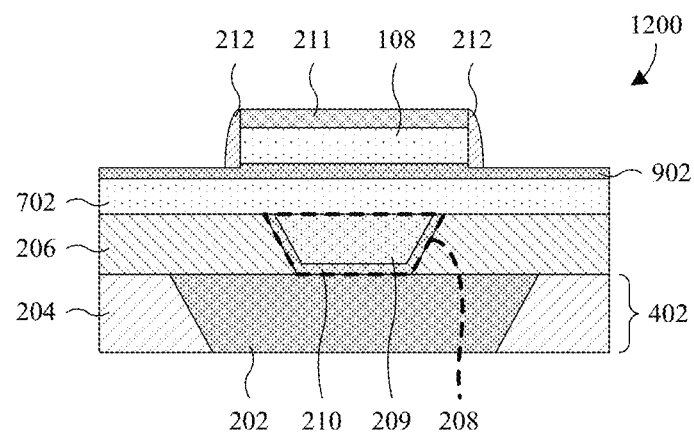

As illustrated by the cross-sectional view 1200 of FIG. 12, a third etch is performed into the spacer layer 1102 (see FIG. 11) to etch back the spacer layer 1102 and to form a spacer 212 from the spacer layer 1102. The spacer 212 comprises a pair of segments respectively on opposite sidewalls of the top electrode 108. Further, in some embodiments, the segments are respectively on opposite sidewalls of the hard mask 211, and/or the opposite sidewalls of the hard mask 211 are respectively even with the opposite sidewalls of the top electrode 108. A process for performing the third etch may comprise, for example, applying one or more etchants to the spacer layer 1202 to remove horizontal segments of the spacer layer 1102 without removing vertical segments of the spacer layer 1202, such that at least one of the vertical segments corresponds to the spacer 212.

Figure 13:
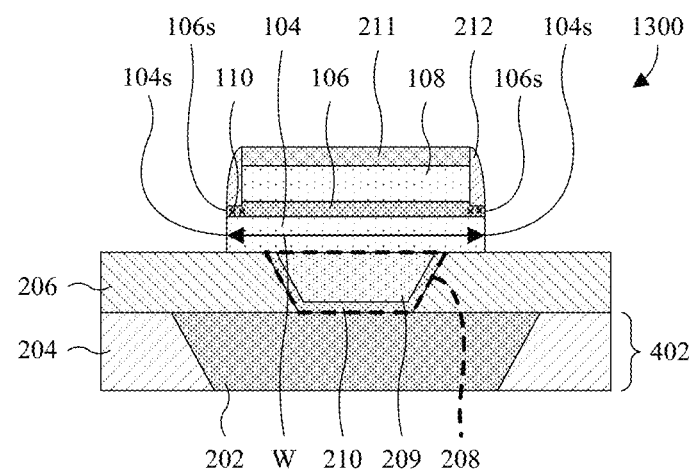

As illustrated by the cross-sectional view 1300 of FIG. 13, a fourth etch is performed into the data storage layer 902 (see FIG. 12) and the bottom electrode layer 702 (see FIG. 12) with the spacer 212 and the hard mask 211 in place to form a data storage element 106 and a bottom electrode 104. The data storage element 106 underlies the top electrode 108 and is formed from the data storage layer 902. The bottom electrode 104 underlies the data storage element 106 and is formed from the bottom electrode layer 702. In some embodiments, a width W of the data storage element 106 and the bottom electrode 104 is about 50-500 nanometers, about 50-200 nanometers, about 300-500 nanometers, or about 150-350 nanometers. The fourth etch forms defects 110 along sidewalls 106s of the data storage element 106 and, in some embodiments, forms sidewalls 104s of the bottom electrode 104 even with the sidewalls 106s of the data storage element 106. For ease of illustration, only one of the defects 110 is labeled 110. The defects 110 may be or comprise, for example, pinhole defects or some other suitable defects in the crystalline lattice of the data storage element 106.

A process for performing the fourth etch may comprise, for example, applying one or more etchants to the data storage layer 902 and the bottom electrode layer 702 until the lower insulating layer 206 is reached by the etchant(s). In some embodiments, the fourth etch is or comprises a plasma etch, such that the etchant(s) may be or comprise, for example, ions or some other suitable plasma-based etchant(s). Further, in some embodiments, the fourth etch is anistropic. The spacer 212 and the hard mask 211 define a mask for the fourth etch, and the lower insulating layer 206 serves as an etch stop for the fourth etch.

Figure 14:
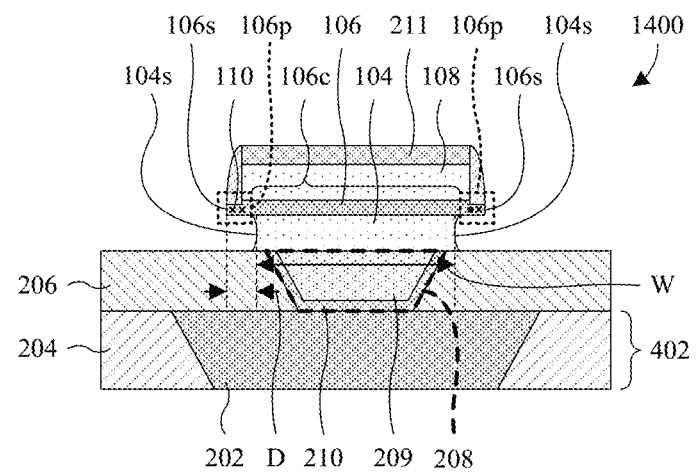

As illustrated by the cross-sectional view 1400 of FIG. 14, a fifth etch is performed into the sidewalls 104s of the bottom electrode 104 to recess the sidewalls 104s of the bottom electrode 104, relative to the sidewalls 106s of the data storage element 106, by a distance D. The distance D may, for example, be about 5-20 nanometers, about 5-10 nanometers, about 10-20 nanometers, or about 1-50 nanometers. The width W of the bottom electrode 104 before the fifth etch may, for example, be about 2.5-500 times the distance D, about 2.5-200 times the distance D, about 300-500 times the distance D, or about 150-350 times the distance D. The width W of the bottom electrode 104 after the fifth etch may, for example, be about 0.5-92 times the distance D, about 0.5-45 times the distance D, about 45-92 times the distance D, or about 20-70 times the distance D. In some embodiments, the sidewalls 104s of the bottom electrode 104 are also spaced completely between the sidewalls 106s of the data storage element 106. In some embodiments, the sidewalls 104s of the bottom electrode 104 have a curved cross-sectional profile, a flat and/or planar cross-sectional profile, or some other suitable cross-sectional profile.

The defects 110 along the sidewalls 106s of the data storage element 106 are localized to a pair of peripheral portions 106p of the data storage element 106. The peripheral portions 106p of the data storage element 106 are respectively on opposite sides of the data storage element 106, and are respectively on opposite sides of a central portion 106c of the data storage element 106. Further, the peripheral portions 106p of the data storage element 106 have an elevated concentration of defects (e.g., pinhole defects or some other suitable crystalline defects) relative to the central portion 106c of the data storage element 106. The sidewalls 104s of the bottom electrode 104 are each recessed by the distance D until laterally spaced away from the defects 110. Further, in some embodiments, the sidewalls 104s of the bottom electrode 104 are each recessed by the distance D until between the central portion 106c of the data storage element 106 and a neighboring one of the peripheral portions 106p of the data storage element 106. In some embodiments, boundaries of the central and peripheral portions 106c, 106p of the data storage element 106 are determined by analyzing the data storage element 106 under a microscope. For example, the microscope may be used to observe crystalline defect concentrations in the data storage element 106, whereby the boundaries of the central and peripheral portions 106c, 106p of the data storage element 106 may be identified. As noted above, the peripheral portions 106p of the data storage element 106 have an elevated concentration of crystalline defects relative to the central portion 106c of the data storage element 106. The microscope may be or comprise, for example, a transmission electron microscope (TEM), a scanning electron microscope (SEM), or some other suitable microscope. In some embodiments, the distance D is a lateral distance from one of the sidewalls 106s of the data storage element 106 to a neighboring boundary between the central and peripheral portions 106c, 106p of the data storage element 106. In other embodiments, the distance D is the lateral distance plus a margin. The margin may be, for example, about 0.1-3.0 nanometers, about 3.0-5.0 nanometers, about 0.1-1.0 nanometers, about 0.1-0.5 nanometers, or about 0.1-2.0 nanometers.

By recessing the sidewalls 104s of the bottom electrode 104, the sidewalls 104s of the bottom electrode 104 are removed from the defects 110 along the sidewalls 106s of the data storage element 106. Therefore, conductive filaments formed hereafter in the data storage element 106 are offset from the defects 110 and hence not effected by, or minimally affected by, the defects 110. This, in turn, improves the reliability and stability of an RRAM cell under manufacture.

A process for performing the fifth etch may comprise, for example, applying one or more etchants to the bottom electrode 104 until the sidewalls 104s of the bottom electrode 104 are sufficiently recessed. As should be appreciated, "sufficiently" recessed may, for example, indicate that the sidewalls 104s of the bottom electrode 104 are spaced from the defects 110 in the peripheral portions 106p of the data storage element 106, and/or may, for example, indicate that the sidewalls 104s of the bottom electrode 104 are recessed by the distance D. In some embodiments, the fifth etch is or comprises a wet etch, such that the etchant(s) may be or comprise, for example, a hydrogen peroxide (e.g., $H_2O_2$) solution, some other suitable chemical solution(s), some other suitable wet etchant(s), or any combination of the foregoing. Further, in some embodiments, the fifth etch is isotropic, and/or the etchant(s) has/have a high etch rate for the bottom electrode 104 relative to the data storage element 106, the spacer 212, the hard mask 211, and the lower insulating layer 206. The former may, for example, facilitate lateral etching of the bottom electrode 104, and the latter may, for example, prevent the data storage element 106, the spacer 212, the hard mask 211, and the lower insulating layer 206 from being materially etched during the fifth etch.

Figure 15:
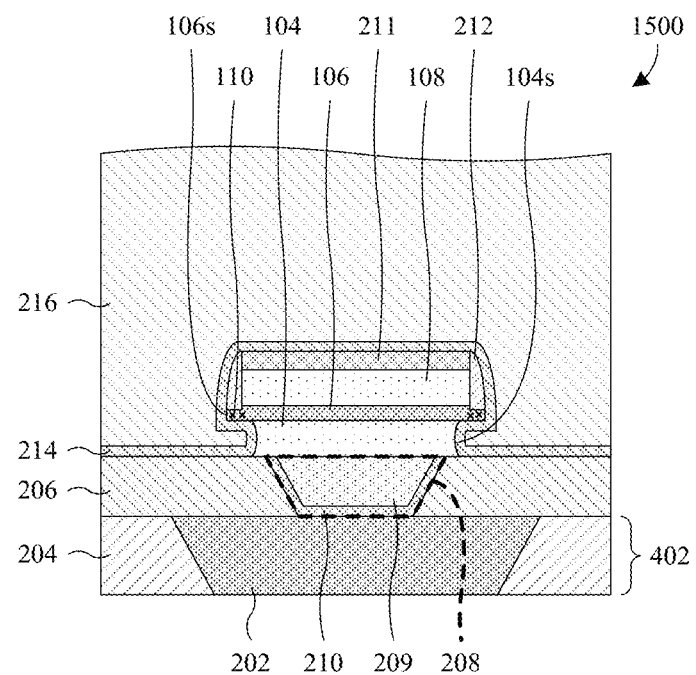

As illustrated by the cross-sectional view 1500 of FIG. 15, an upper insulating layer 214 is formed covering the lower insulating layer 206, the spacer 212, and the hard mask 211. Further, the upper insulating layer 214 is formed lining sidewalls of the spacer 212, the sidewalls 106s of the data storage element 106, and the sidewalls 104s of the bottom electrode 104. The upper insulating layer 214 may be or comprise, for example, silicon nitride (e.g., SiN), some other suitable nitride(s), some other suitable dielectric(s), or any combination of the foregoing. In some embodiments, the upper insulating layer 214 is formed by conformal deposition, and/or is formed by CVD, PVD, ALD, some other suitable deposition process(es), or any combination of the foregoing.

Also illustrated by the cross-sectional view 1500 of FIG. 15, an upper ILD layer 216 is formed covering the upper insulating layer 214. The upper ILD layer 216 may be or comprise, for example, silicon oxide (e.g., SiO), a low κ dielectric, some other suitable dielectric(s), or any combination of the foregoing. The upper ILD layer 216 may, for example, be formed by CVD, PVD, sputtering, some other suitable deposition process(es), or any combination of the foregoing.

Figure 16:
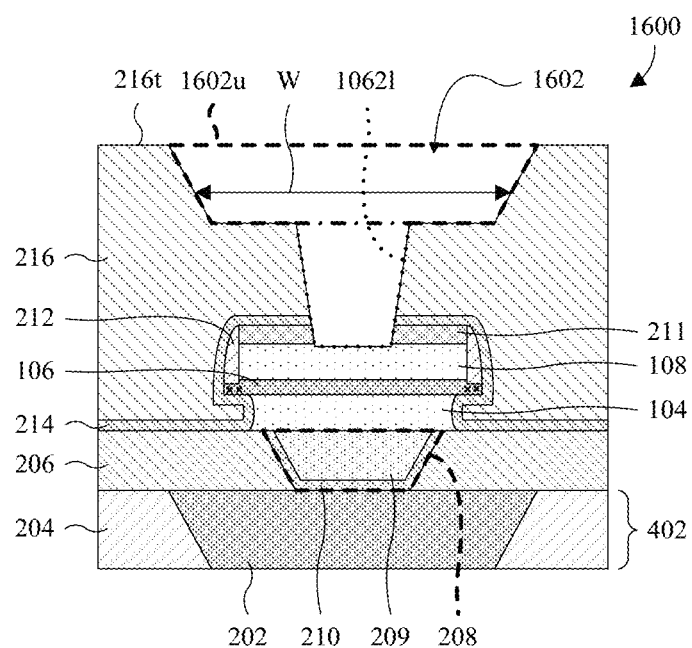

Also illustrated by the cross-sectional view 1600 of FIG. 16, the upper ILD layer 216, the upper insulating layer 214, and the hard mask 211 are patterned to form an upper opening 1602 overlying and exposing the top electrode 108. The upper opening 1602 includes a layout of a TEVA under manufacture, as well as a layout of an upper wire under manufacture. In some embodiments, the upper opening 1602 has a T-shaped profile or some other suitable profile. Further, in some embodiments, the upper opening 1602 comprises an upper region 1602u with a profile corresponding to a wire under manufacture, and further comprises a lower region 1602l with a profile of a via under manufacture. Further, in some embodiments, a width W of the upper opening 1602 discretely decreases from top to bottom. The width W may, for example, discretely discrete at a boundary between the upper and lower regions 1602u, 1602l of the opening 1602, and/or width W may, for example, be greater at the upper region 1602u of the opening 1602 than the lower region 1602l of the opening 1602.

In some embodiments, a process for performing the patterning comprises forming a first photoresist mask (not shown) on the upper ILD layer 216. The first photoresist mask may, for example, be formed by depositing a first photoresist layer on the upper ILD layer 216 and patterning the first photoresist layer so the first photoresist layer has an opening with a layout of the upper wire under manufacture. One or more first etchants are applied to the upper ILD layer 216 with the first photoresist mask in place to partially form the upper opening 1602, and the first photoresist mask is thereafter removed. A second photoresist mask (not shown) is formed on the upper ILD layer 216. The second photoresist mask may, for example, be formed by depositing a second photoresist layer on the upper ILD layer 216 and patterning the second photoresist layer with an opening overlapping the upper opening 1602 and having a layout of the TEVA under manufacture. One or more second etchants are applied to the upper ILD layer 216, the upper insulating layer 214, and the hard mask 211 with the second photoresist mask in place to expand and complete the upper opening 1602, and the second photoresist mask is thereafter removed. The depositing of the first and second photoresist layers may, for example, be performed by spin coating or some other suitable deposition process, and/or the patterning of the first and second photoresist layers may, for example, be performed by photolithography or some other suitable patterning process. The removal of the first and second photoresist masks may, for example, be performed by plasma ashing or some other suitable removal process.

Figure 17:
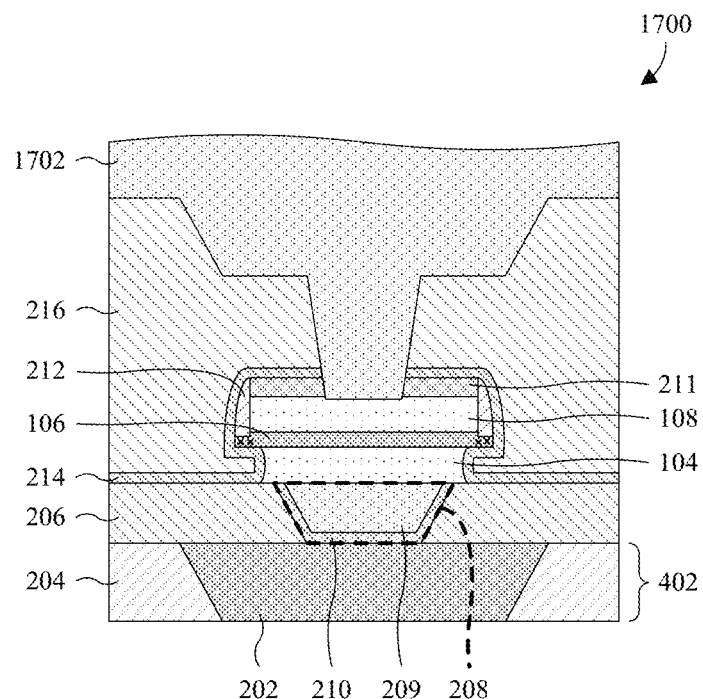

As illustrated by the cross-sectional view 1700 of FIG. 17, an upper conductive layer 1702 is formed covering the upper ILD layer 216 and filling the upper opening 1602 (see FIG. 16). The upper conductive layer 1702 may be or comprise, for example, tungsten, copper, aluminum copper, aluminum, titanium, tantalum, titanium nitride, tantalum nitride, some suitable other metal(s), some other suitable conductive material(s), or any combination of the foregoing. The upper conductive layer 1702 may, for example, be formed by CVD, PVD, electroless plating, electroplating, some other suitable plating or deposition process(es), or any combination of the foregoing.

Figure 18:
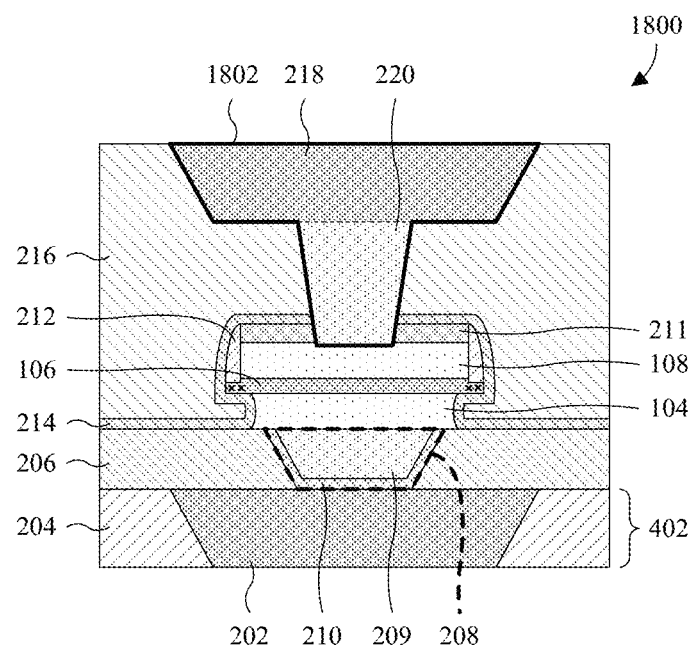

As illustrated by the cross-sectional view 1800 of FIG. 18, a third planarization is performed into a top surface of the upper conductive layer 1702 (see FIG. 17), until the upper ILD layer 216 is reached, to form an upper conductive structure 1802 in the upper opening 1602 (see FIG. 16). The upper conductive structure 1802 comprises a TEVA 220 and an upper wire 218. The upper wire 218 overlies the TEVA 220, and the TEVA 220 extends from the upper wire 218 to the top electrode 108. Note that the hashing between the TEVA 220 and the upper wire 218 has been varied to emphasize the TEVA 220 and the upper wire 218, notwithstanding that the TEVA 220 and the upper wire 218 are integrated and continuous with one another in the embodiments of FIG. 19. The third planarization may, for example, be performed by a CMP or some other suitable planarization process.

While FIGS. 15-17 illustrate a dual damascene process for forming the TEVA 220 and the upper wire 218, it is to be appreciated that a single damascene process may alternatingly be used. As should be appreciated, a dual damascene process forms two conductive features (e.g., a wire and a via) at the same time, whereas a single damascene process forms a single conductive feature (e.g., a wire or a via) at time. For example, instead of forming the TEVA 220 and the upper wire 218 together, the TEVA 220 and the upper wire 218 may be individually formed.

Figure 19:
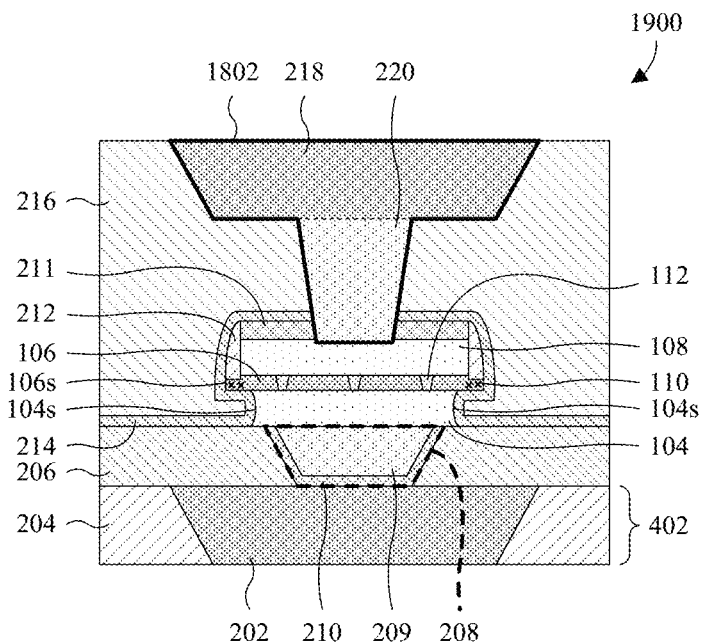

As illustrated by the cross-sectional view 1900 of FIG. 19, a forming voltage is applied from the bottom electrode 104 to the top electrode 108 to form conductive filaments 112 in the data storage element 106. Because the sidewalls 104s of the bottom electrode 104 are recessed, the electric field produced by application of the forming voltage is low along the sidewalls 106s of the data storage element 106 and hence along the defects 110. Namely, the electric field concentrates at corners of the bottom electrode 104. Further, the recessing moves the corners of the bottom electrode 104 away from the sidewalls 106s of the data storage element 106 and the defects 110. Therefore, the electric field is low across the sidewalls 106s of the data storage element 106 and the defects 110. Because the electric field is low across the sidewalls 106s and the defects 110, the conductive filaments 112 do not or are less likely to form along the sidewalls 106s of the data storage element 106. This, in turn, prevents the defects 110 from interfering with switching the RRAM cell 102, or otherwise mitigates the effect the defects 110 have on the switching of the RRAM cell 102.

Figure 20:
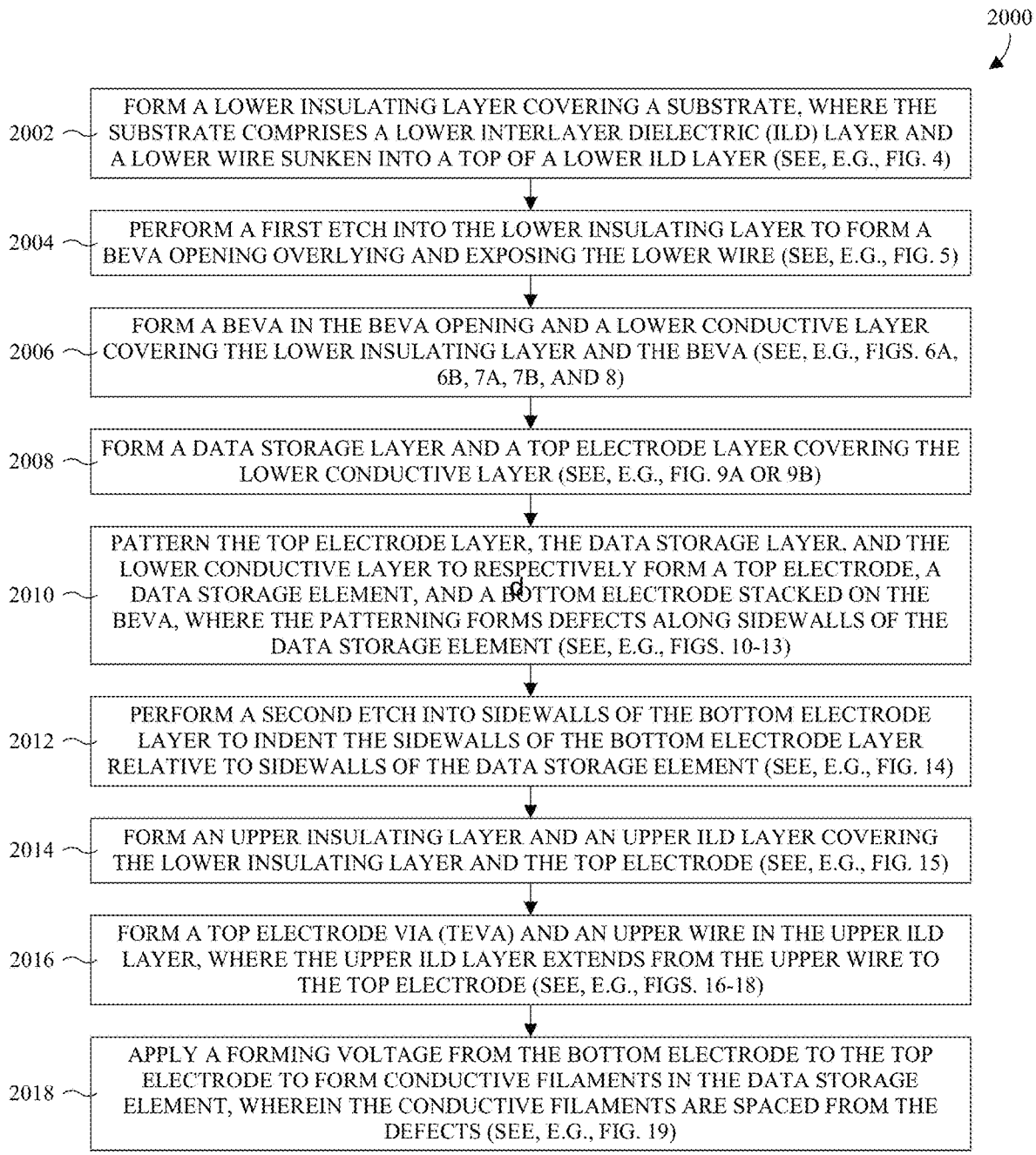
FIG. 20 illustrates a flowchart of some embodiments of the method of FIGS. 4-5, 6A, 6B, 7A, 7B, 8, 9A, 9B, and 10-19.

With reference to FIG. 20, a flowchart 2000 of some embodiments of the method of FIGS. 4-5, 6A, 6B, 7A, 7B, 8, 9A, 9B, and 10-19 is provided.

At 2002, a lower insulating layer is formed covering a substrate. The substrate comprises a lower ILD layer and a lower wire sunken into a top of a lower ILD layer. See, for example, FIG. 4.

At 2004, a first etch is performed into the lower insulating layer to form a BEVA opening overlying and exposing the lower wire. See, for example, FIG. 5.

At 2006, a BEVA is formed in the BEVA opening and a lower conductive layer is formed covering the lower insulating layer and the BEVA. In some embodiments, the lower conductive layer is integrated and continuous with the BEVA. In other embodiments, the lower conductive layer is independent of the BEVA. See, for example, FIGS. 6A, 6B, 7A, 7B, and 8. Note that FIGS. 6A and 6B are alternative embodiments, and FIG. 8 is an alternative embodiment for FIGS. 7A and 7B. Further, note that FIG. 7A may proceed from FIG. 6A or 6B, and FIG. 8 may proceed from FIG. 6A or 6B.

At 2008, a data storage layer and a top electrode layer are formed covering the lower conductive layer. See, for example, FIG. 9A or 9B. Note that FIGS. 9A and 9B are alternatives embodiments.

At 2010, the top electrode layer, the data storage layer, and the lower conductive layer are patterned to respectively form a top electrode, a data storage element, and a bottom electrode stacked on the BEVA. The patterning forms defects (e.g., pinhole defects or some other suitable defects) along sidewalls of the data storage element. See, for example, FIGS. 10-13.

At 2012, a second etch is performed into sidewalls of the bottom electrode layer to recess the sidewalls of the bottom electrode layer relative to sidewalls of the data storage element. See, for example, FIG. 14.

At 2014, an upper insulating layer and an upper ILD layer are formed covering the lower insulating layer and the top electrode. See, for example, FIG. 15.

At 2016, a TEVA and an upper wire are formed in the upper ILD layer. The upper ILD layer extends from the upper wire to the top electrode. See, for example, FIGS. 16-18.

At 2018, a forming voltage is applied from the bottom electrode to the top electrode to form conductive filaments in the data storage element. See, for example, FIG. 19. The conductive filaments are spaced from the defects because the sidewalls of the bottom electrode are recessed. This, in turn, prevents the defects from interfering with switching the RRAM cell, or otherwise mitigates the effect the defects have on the switching of the RRAM cell.

While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application is directed towards an integrated circuit comprising a memory cell, wherein the memory cell includes: a lower electrode including a pair of electrode sidewalls, wherein the electrode sidewalls are respectively on opposite sides of the lower electrode; a data storage element overlying the lower electrode and including a pair of storage sidewalls, wherein the storage sidewalls are respectively on the opposite sides of the lower electrode, and wherein the electrode sidewalls are laterally spaced from and laterally between the storage sidewalls; and an upper electrode overlying the data storage element. In some embodiments, the lower electrode has a first width, and the data storage element has a second width greater than the first width. In some embodiments, the electrode sidewalls include a first electrode sidewall and a second electrode sidewall, wherein the data storage element extends laterally and continuously from the first electrode sidewall to the second electrode sidewall in a first direction, and wherein the data storage element further extends laterally and continuously past the second electrode sidewall in the first direction. In some embodiments, the data storage element includes conductive filaments laterally between the electrode sidewalls, wherein the data storage element is devoid of conductive filaments laterally from the electrode sidewalls respectively to neighboring ones of the storage sidewalls. In some embodiments, the electrode sidewalls are concave. In some embodiments, the data storage element directly contacts the lower electrode. In some embodiments, the data storage element includes a high κ dielectric layer, and the high κ dielectric layer has a dielectric constant κ greater than about 10. In some embodiments, the memory cell further includes a capping element overlying the data storage element, wherein the capping element has a higher reactivity with oxygen than the upper electrode, and wherein the upper electrode overlies the capping element. In some embodiments, the upper electrode directly contacts the data storage element.

In some embodiments, the present application is directed towards a method for forming an integrated circuit including a memory cell, the method including: forming a lower conductive layer on a substrate; forming a data storage layer overlying the lower conductive layer; forming an upper conductive layer overlying the data storage layer; patterning the upper conductive layer, the data storage layer, and the lower conductive layer to respectively form an upper electrode, a data storage element, and a lower electrode stacked on the substrate, wherein the patterning forms sidewall defects in storage sidewalls of the data storage element; and performing an etch into the lower electrode to laterally recess electrode sidewalls of the lower electrode respectively relative to neighboring ones of the storage sidewalls. In some embodiments, the patterning includes performing a second etch into the data storage layer and the lower conductive layer to respectively form the data storage element and the lower electrode, wherein the storage sidewalls are respectively aligned with the electrode sidewalls upon completion of the second etch. In some embodiments, the second etch is performed by a plasma etch and forms the sidewall defects in the storage sidewalls, wherein the etch is performed by a wet etch. In some embodiments, the patterning further includes: forming a hard mask overlying a memory region of the upper conductive layer; performing a third etch into the upper conductive layer with the hard mask in place to form the upper electrode, wherein the third etch stops on the data storage layer; and forming spacer segments on sidewalls of the upper electrode, wherein the second etch is performed with the hard mask and the spacer segments in place. In some embodiments, the lower electrode includes titanium nitride, wherein the etch includes applying a hydrogen peroxide solution to the lower electrode to laterally recess the electrode sidewalls. In some embodiments, the method further includes performing a second etch into the substrate to form a via opening, wherein the forming of the lower conductive layer includes: depositing the lower conductive layer covering the substrate and filling the via opening; and performing a planarization into the lower conductive layer to flatten a top surface of the lower conductive layer, wherein the flattened top surface of the lower conductive layer is spaced over a top surface of the substrate. In some embodiments, the lower conductive layer includes a diffusion barrier layer and a metal layer overlying the diffusion barrier layer. In some embodiments, the method further includes: performing a second etch into the substrate to form a via opening; depositing a conductive via layer covering the substrate and filling the via opening; and performing a planarization into a top surface of the conductive via layer until a top surface of the substrate is reached, thereby forming a via in the via opening from the conductive via layer, wherein the lower conductive layer is formed on the via. In some embodiments, the conductive via layer includes a diffusion barrier layer and a metal layer overlying the diffusion barrier layer.

In some embodiments, the present application is directed towards another integrated circuit including: a lower wire; a lower insulating layer overlying the lower wire; a first via extending through the lower insulating layer to the lower wire; and a memory cell overlying and directly on the first via, wherein the memory cell includes a lower electrode, a data storage element overlying the lower electrode, and an upper electrode overlying the data storage element, wherein sidewalls of the lower electrode are laterally recessed relative to neighboring sidewalls of the data storage element, respectively, wherein the data storage element includes a central data portion and a pair of peripheral data portions, wherein the peripheral data portions are respectively on opposite sides of the central data portion and respectively border the neighboring sidewalls of the data storage element, wherein the peripheral data portions have an elevated concentration of crystalline defects relative to the central data portion, and wherein the sidewalls of the lower electrode are each laterally between the central data portion and a neighboring one of the peripheral data portions. In some embodiments, each of the sidewalls of the lower electrode is recessed relative to a respective one of the neighboring sidewalls of the data storage element by a recess amount, wherein a width of the lower electrode is about 0.5-92 times the recess amount.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising a memory cell, wherein the memory cell comprises:
    a lower electrode comprising a pair of electrode sidewalls, wherein the electrode sidewalls are respectively on opposite sides of the lower electrode;
    a data storage element overlying the lower electrode and comprising a pair of storage sidewalls, wherein the storage sidewalls are respectively on the opposite sides of the lower electrode, wherein the electrode sidewalls are laterally spaced from and laterally between the storage sidewalls, wherein the data storage element has a first concentration of crystalline defects at the storage sidewalls and further has a second concentration of crystalline defects offset from the storage sidewalls, wherein the second concentration is less than the first concentration, wherein the electrode sidewalls have top edges that are at locations at which the data storage element transitions from the first concentration to the second concentration, and wherein the electrode sidewalls further have bottom edges that underlie and are even respectively with the locations; and
    an upper electrode overlying the data storage element.

2. The integrated circuit according to claim 1, wherein the lower electrode has a first width, and wherein the data storage element has a second width greater than the first width.

3. The integrated circuit according to claim 1, wherein the electrode sidewalls comprise a first electrode sidewall and a second electrode sidewall, wherein the data storage element extends laterally and continuously from the first electrode sidewall to the second electrode sidewall in a first direction, and wherein the data storage element further extends laterally and continuously past the second electrode sidewall in the first direction.

4. The integrated circuit according to claim 1, wherein the data storage element comprises conductive filaments laterally between the electrode sidewalls, and wherein the data storage element is devoid of conductive filaments laterally from the electrode sidewalls respectively to neighboring ones of the storage sidewalls.

5. The integrated circuit according to claim 1, wherein the electrode sidewalls are concave.

6. The integrated circuit according to claim 1, wherein the data storage element directly contacts the lower electrode.

7. The integrated circuit according to claim 1, wherein the data storage element comprises a high κ dielectric layer, and wherein the high κ dielectric layer has a dielectric constant κ greater than about 10.

8. The integrated circuit according to claim 1, wherein the memory cell further comprises:
a capping element overlying the data storage element, wherein the capping element has a higher reactivity with oxygen than the upper electrode, and wherein the upper electrode overlies the capping element.

9. The integrated circuit according to claim 1, further comprising:
a dielectric layer covering the memory cell and further contacting the electrode sidewalls and the data storage element, wherein the dielectric layer extends along the electrode sidewalls from a top surface of the lower electrode to a bottom surface of the lower electrode, and wherein the dielectric layer is laterally indented at a location at which the data storage element overlies the dielectric layer.

10. An integrated circuit comprising:
a lower wire;
a lower insulating layer overlying the lower wire;
a first via extending through the lower insulating layer to the lower wire;
a memory cell overlying and directly on the first via, wherein the memory cell comprises a lower electrode, a data storage element overlying the lower electrode, and an upper electrode overlying the data storage element, wherein sidewalls of the lower electrode are laterally recessed relative to neighboring sidewalls of the data storage element, respectively, wherein the data storage element comprises a central data portion and a pair of peripheral data portions, wherein the peripheral data portions are respectively on opposite sides of the central data portion and respectively border the neighboring sidewalls of the data storage element, wherein the peripheral data portions have an elevated concentration of crystalline defects relative to the central data portion, and wherein the sidewalls of the lower electrode are each laterally between the central data portion and a neighboring one of the peripheral data portions; and
an upper insulating layer covering the memory cell and the lower insulating layer, and further contacting the sidewalls of the lower electrode, wherein the data storage element overhangs and contacts the upper insulating layer.

11. The integrated circuit according to claim 10, wherein each of the sidewalls of the lower electrode is recessed relative to a respective one of the neighboring sidewalls of the data storage element by a recess amount, and wherein a width of the lower electrode is about 0.5-92 times the recess amount.

12. The integrated circuit according to claim 10, wherein the sidewalls of the lower electrode each arc from a top surface of the lower electrode to a bottom surface of the lower electrode.

13. The integrated circuit according to claim 10, wherein the data storage element comprises a conductive filament in the central data portion, and wherein the data storage element is devoid of conductive filaments in the peripheral data portions.

14. An integrated circuit comprising:
a memory cell comprising:
a lower electrode;
a data storage element overlying the lower electrode; and
an upper electrode overlying the data storage element;
a dielectric structure covering the memory cell, wrapping around a bottom corner of the data storage element, and extending along a bottom surface of the data storage element from the bottom corner to the lower electrode, wherein the dielectric structure has a C-shaped portion directly contacting a sidewall of the lower electrode and the bottom surface of the data storage element, and wherein the C-shaped portion directly underlies the bottom surface of the data storage element and is laterally between the bottom corner and the lower electrode; and
an interlayer dielectric (ILD) layer covering the dielectric structure and the memory cell, wherein the ILD layer is a different material than the dielectric structure and has a protrusion, wherein the protrusion protrudes under the data storage element towards the sidewall of the lower electrode, and wherein the C-shaped portion wraps around the protrusion to separate the protrusion from the sidewall.

15. The integrated circuit according to claim 14, wherein the dielectric structure contacts the sidewall of the lower electrode at an interface, and wherein the interface is curved.

16. The integrated circuit according to claim 14, wherein the data storage element has a first concentration of crystalline defects directly over the C-shaped portion, and further has a second concentration of crystalline defects laterally offset from the C-shaped portion, and wherein the second concentration is less than the first concentration.

17. The integrated circuit according to claim 14, wherein the upper electrode has an upper-electrode width between a lower-electrode width of the lower electrode and a data-element width of the data storage element.

18. The integrated circuit according to claim 14, wherein sidewalls of the data storage element directly underlie the upper electrode and are offset from neighboring sidewalls of the data storage element.

19. The integrated circuit according to claim 14, further comprising:
a lower wire; and
a first via extending from the lower electrode to the lower wire.

20. The integrated circuit according to claim 14, wherein lower electrode has a central portion with a first concentration of crystalline defects and further has a peripheral portion with a second concentration of crystalline defects, wherein the second concentration is higher than the first concentration, and wherein the sidewall of the lower electrode is at an interface at which the central and peripheral portions contact.

* * * * *